United States Patent [19]
Kikinis

[11] Patent Number: 5,680,126
[45] Date of Patent: *Oct. 21, 1997

[54] MODULAR PORTABLE COMPUTER

[75] Inventor: Dan Kikinis, Sratoga, Calif.

[73] Assignee: Elonex I.P. Holdings, Ltd., London, United Kingdom

[*] Notice: The term of this patent shall not extend beyond the expiration date of Pat. No. 5,278,730.

[21] Appl. No.: 294,750

[22] Filed: Aug. 23, 1994

Related U.S. Application Data

[63] Continuation-in-part of Ser. No. 97,946, Jul. 26, 1993, Pat. No. 5,278,730, which is a continuation of Ser. No. 905,480, Jun. 29, 1992, abandoned, and a continuation-in-part of Ser. No. 31,805, Mar. 15, 1993, Pat. No. 5,365,230.

[51] Int. Cl.[6] ............................................. H03K 17/94
[52] U.S. Cl. .............................. 341/22; 341/26; 341/32; 361/686
[58] Field of Search ........................ 341/22, 24, 32, 341/33, 34, 26; 361/686, 683, 726, 727; 200/5 A; 174/254

[56] References Cited

U.S. PATENT DOCUMENTS

| | | | |
|---|---|---|---|
| 3,911,234 | 10/1975 | Kotaka | 200/5 A |
| 4,765,218 | 8/1988 | Eppinger | 341/32 |
| 5,278,730 | 1/1994 | Kikinis | 361/686 |
| 5,406,273 | 4/1995 | Nishida et al. | 341/24 |

*Primary Examiner*—Jeffery Hofsass
*Assistant Examiner*—Andrew Hill
*Attorney, Agent, or Firm*—Donald R. Boys

[57] ABSTRACT

A modular computer has a framework with module bays for receiving CPU modules, power modules, and peripheral function modules such as floppy and hard disk drives. The framework has a built-in compressed bus and a variety of function modules which can be plugged into any one of the module bays. Function modules include, but are not limited to, CPU, power, floppy disk, hard disk, RAM memory, LAN communication, modem, FAX communication, and data acquisition. In some embodiments function modules are provided for communicating with separate input means, such as voice, keyboards, and pen-pads. In one aspect the module bays and the function modules are configured according to dimensional and connective standards of the Personal Computer Memory Card International Association. In another aspect a modular portable computer has a flexible, rollable, keyboard with a system for transmitting keystroke signals by magnetic induction.

7 Claims, 31 Drawing Sheets

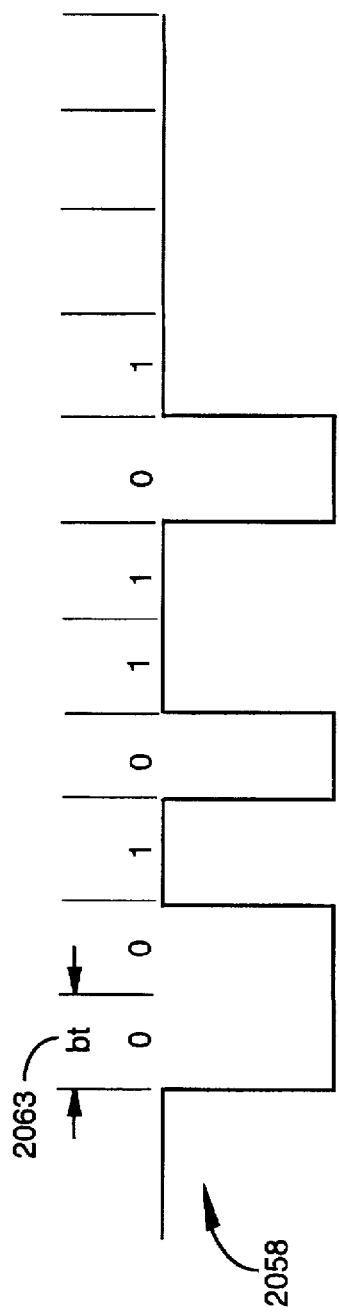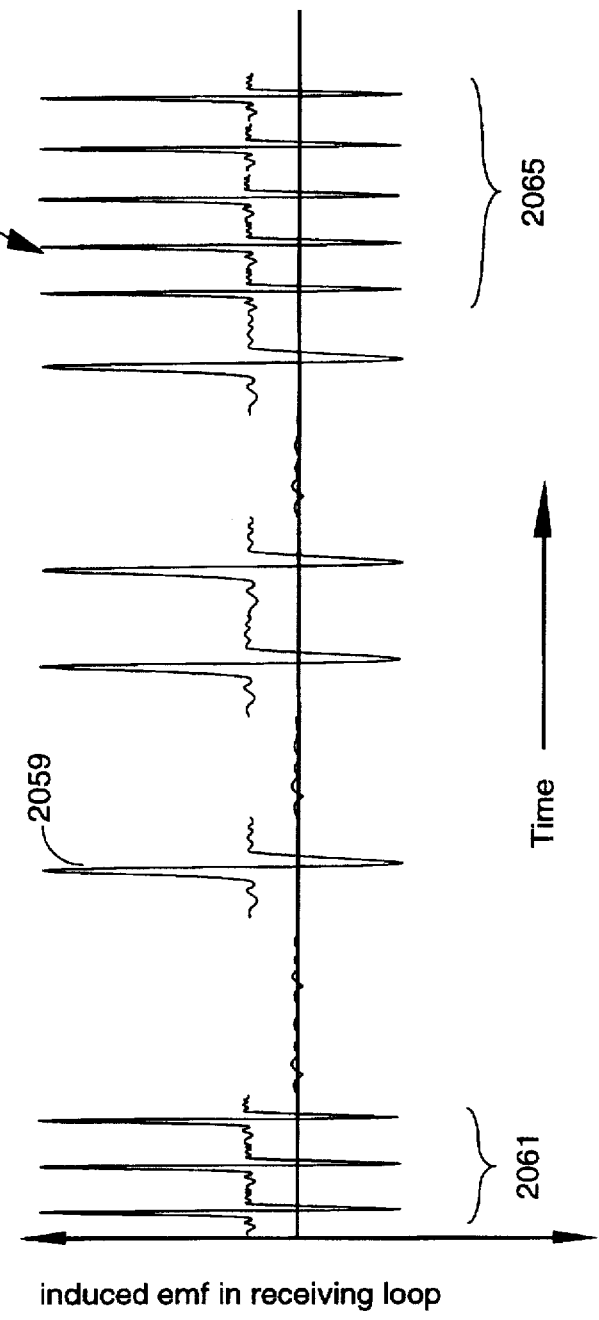

MODULAR PORTABLE COMPUTER

CROSS REFERENCE TO RELATED DOCUMENTS

This application is a continuation-in-part of application Ser. No. 08/097,946, now U.S. Pat. No. 5,278,730, filed Jul. 26, 1993 which is a continuation of application Ser. No. 07/905,480, filed Jun. 29, 1992 abandoned. It is also a continuation-in-part of application Ser. No. 08/031,805, now U.S. Pat. No. 5,365,230, filed Mar. 15, 1993. This application, in addition, contains the entire disclosure of U.S. Pat. No. 5,220,521.

FIELD OF THE INVENTION

The present invention is in the area of portable computer systems, and is particularly relevant to portable computers known as notebook, sub-notebook, and palmtop computers.

BACKGROUND OF THE INVENTION

Portable computers are popular among computer users who travel and need to take their work along, and there is a tendency in the marketplace to smaller and smaller versions of portable computers. They are smaller and lighter than laptops, and are therefore more portable. The evolution to smaller and lighter portable computers, however, is not without problems. For one thing, smaller portable computers means less space for battery packs, which usually means shorter useful life between recharges. Another problem related to smaller size is a difficulty in providing versatility. Smaller size naturally means less space to provide a broad choice in peripheral devices and options.

Yet another problem is related to addresses and data byte size. State-of-the-art computers are capable of 32 bit addresses and 32 bit data words. A 32 bit computer, though, typically needs a bus structure with nearly 100 active signals, equating to high pin count and extensive device and component density. Such high density in a small computer creates many other problems, such as problems with heat dissipation. These are a few of the many problems in designing and developing portable computers.

What is needed is a new design for portable computers based on a bus structure allowing 32-bit capability with a minimum pin count, utilizing, for example, multiplexing of address and data on a single 32 bit structure, and utilizing only state-of-the-art technology to minimize power (hence buffer) requirements, which also minimizes heat and equipment complexity and density problems. Also, modularity needs to be raised to a new level by making virtually all components modular and "plug-in", including CPUs, power packs, and all of the various known sorts of peripheral devices.

SUMMARY OF THE INVENTION

In an embodiment of the present invention a modular computer is provided comprising a support structure for supporting and enclosing elements of the modular computer, a plurality of module bays configured in a common plane, the module bays opening to at least one edge of the support structure and configured to dock functional modules, a first multi-pin electrical connector at the inboard end of each module bay for engaging a second electrical connector of a functional module, and an internal bus connected to each of the electrical connectors in the module bays. There is also a display and a substantially planar input means for providing user input to the modular computer, the input means attached to the support structure substantially coplanar with and overlying the plane of the module bays. Each module bay comprises a guide means for guiding a module in docking operations, a retaining means for holding a module when docked, and a user-operable expulsion means for disengaging a docked module. In a preferred embodiment the module bays are configured for docking functional modules according to one of Personal Computer Memory Card International Association standards Type I, Type II, and Type III.

In one preferred embodiment the input means is a keyboard, and the display is a flat panel display hinged to the support structure, and closable over the keyboard for storage and transport.

Functional modules are provided serving a wide variety of functions. One module comprises a CPU, which provides flexibility in CPU type and power, and upgradability as well. A CPU module may also incorporate random access memory and video display control. Function modules also are provided to enhance flexibility in input. Separate input devices, such as a full-size keyboard or a pen-based input tablet may be used with appropriate modules for receiving signals from the separate input devices and providing the signals to the internal bus. An input module for voice input, recognizing human speech, is also provided. Other function modules include Fax modems, telephone modems, floppy drives, hard disk drives, LAN communication modules, and data acquisition modules.

BRIEF DESCRIPTION OF THE DRAWINGS

FIG. 32A is an exemplary trace of emf in a receiving loop according to an embodiment of the invention.

FIG. 32B is a serial digital scan code as reconstructed from the magnetically encoded code of FIG. 32A.

DESCRIPTION OF THE PREFERRED EMBODIMENTS

General Description

Figure 1A:
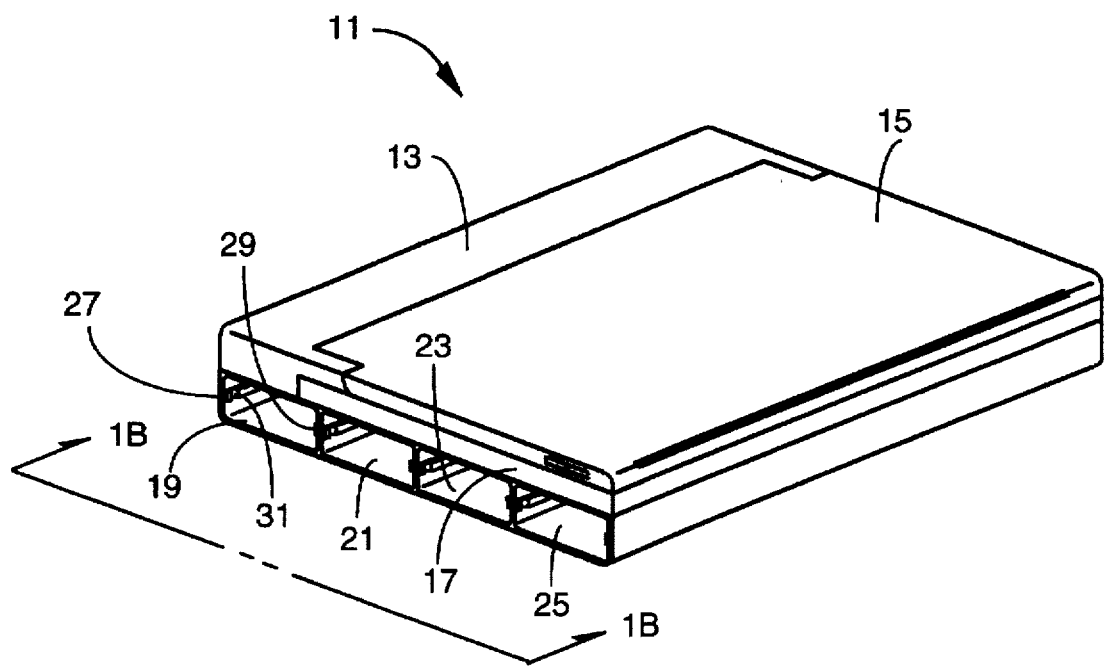
FIG. 1A is an isometric view of a modular notebook computer framework according to an embodiment of the present invention.

FIG. 1A is an isometric drawing of a notebook computer framework 11 according to the invention. Framework 11 comprises a back housing 13, a tilt-up flat panel display 15, shown closed, a keyboard 17, and a plurality of module bays for plugging in function modules. Back housing 13 includes a power unit for converting electrical input on a wide variety of standards to the form required by the computer. For example, there is a port (not shown) for connecting to a standard household outlet, rated at 120 V., 60 Hz, alternating current. The power unit will convert the input to outputs as needed by the computer bus and functional modules. There are also input ports for 6 V. DC, 12 V. DC, 9 V. DC, and others, and the power unit in one embodiment of the present invention is capable of recognizing the input characteristics by sampling, and switching to proper on-board circuitry to utilize the input.

In the embodiment shown by FIG. 1A four module bays 19, 21, 23, and 25 are shown along one side of the framework. There are four more module bays along the other side of the framework opposite the module bays shown. There could be more or fewer module bays, but eight is convenient and a good balance between the need to stay small and simple, and to also have adequate versatility.

Figure 1B:
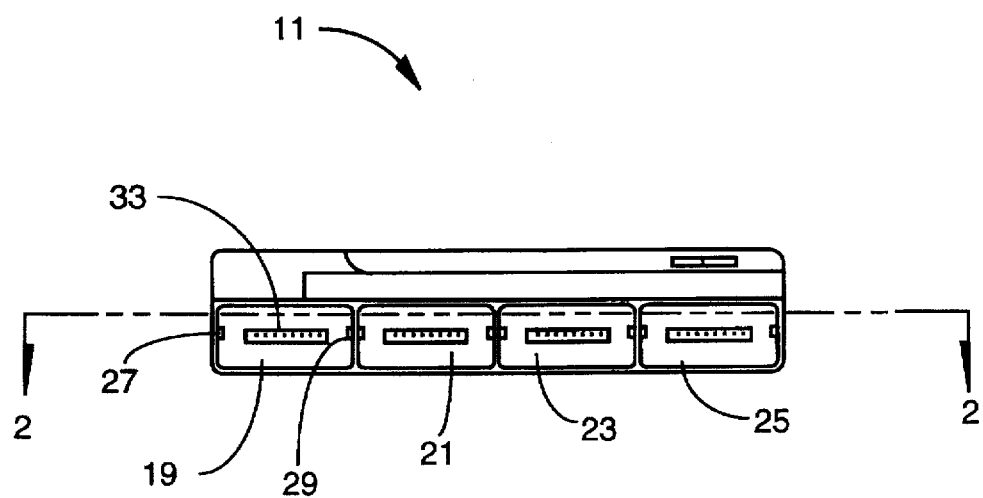
FIG. 1B is a view of the computer framework of FIG. 1A from one side from the vantage of line 1B—1B on FIG. 1A.

FIG. 1B is an end view of the notebook computer framework of FIG. 1A in the direction of arrows 1B—1B of FIG. 1A. Each of the module bays has a set of guide and positioning rails such as rails 27 and 29 in bay 19. The rails are to position and guide a function module inserted into the module bay. Each rail in a set has a detent such as detent 31 for latching a module when the module is fully inserted in the bay. Each bay also has a connector such as connector 33 in bay 19. The connectors are for coupling to a mating connector on a function module inserted in a bay. It will be apparent to a person with skill in the art that there are a number of equivalent ways guide rails, detents, and coupling may be accomplished.

Figure 2:
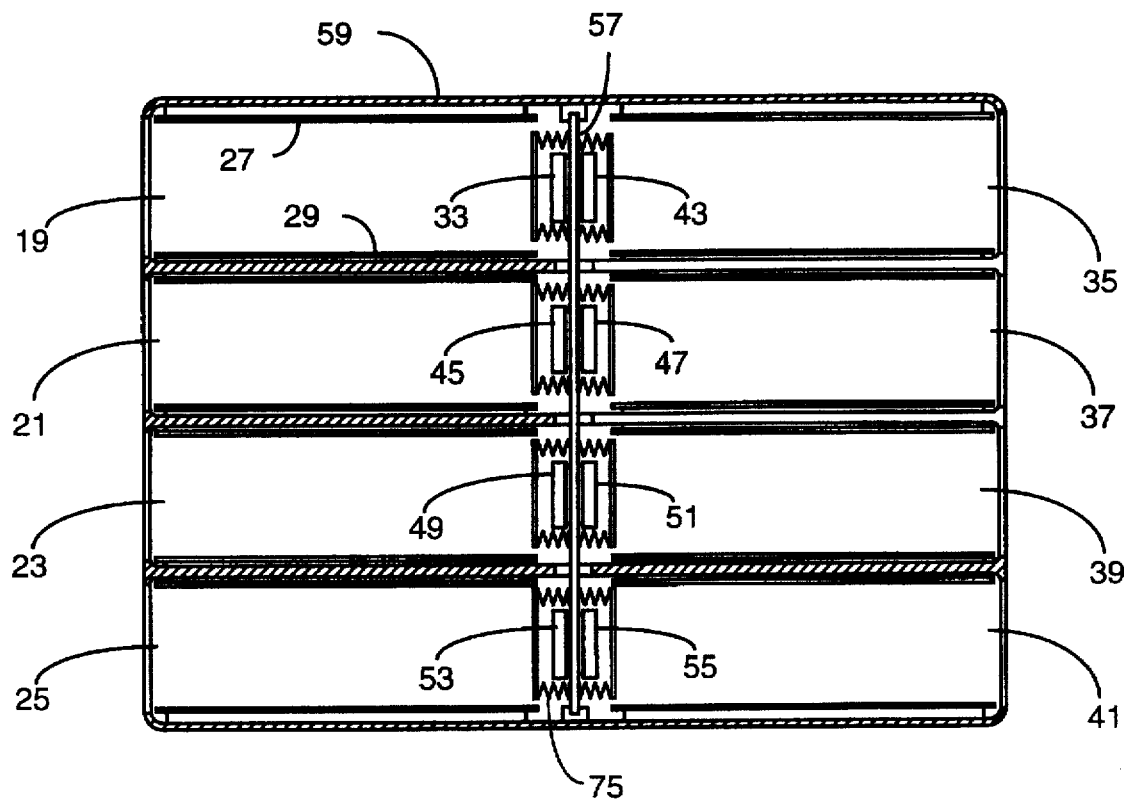
FIG. 2 is a sectioned plan view of the computer framework of FIG. 1A taken according to section line 2—2 of FIG. 1B.

FIG. 2 is a plan section view just above the module bays taken along section line 2—2 of FIG. 1B. Bays 19, 21, 23, and 25 are shown on one side of the section view, and bays 35, 37, 39, and 41 along the opposite side. A printed circuit board structure 57 is fastened in a substantially vertical position down the center of frame 59, and connectors 33, 43, 45, 47, 49, 51, 53, and 55 are connected to the printed circuit board structure and present their pin structure outward toward the respective bay areas. In the presently described embodiment the internal connectors are male connectors, but this is not a requirement of the invention.

As also shown in FIG. 1A, each module bay has a pair of opposed rails located vertically at about the midpoint of the height of the module bay. Rails 27 and 29 serve module bay 19, and similar rails are located in each of the other module bays.

Figure 3:
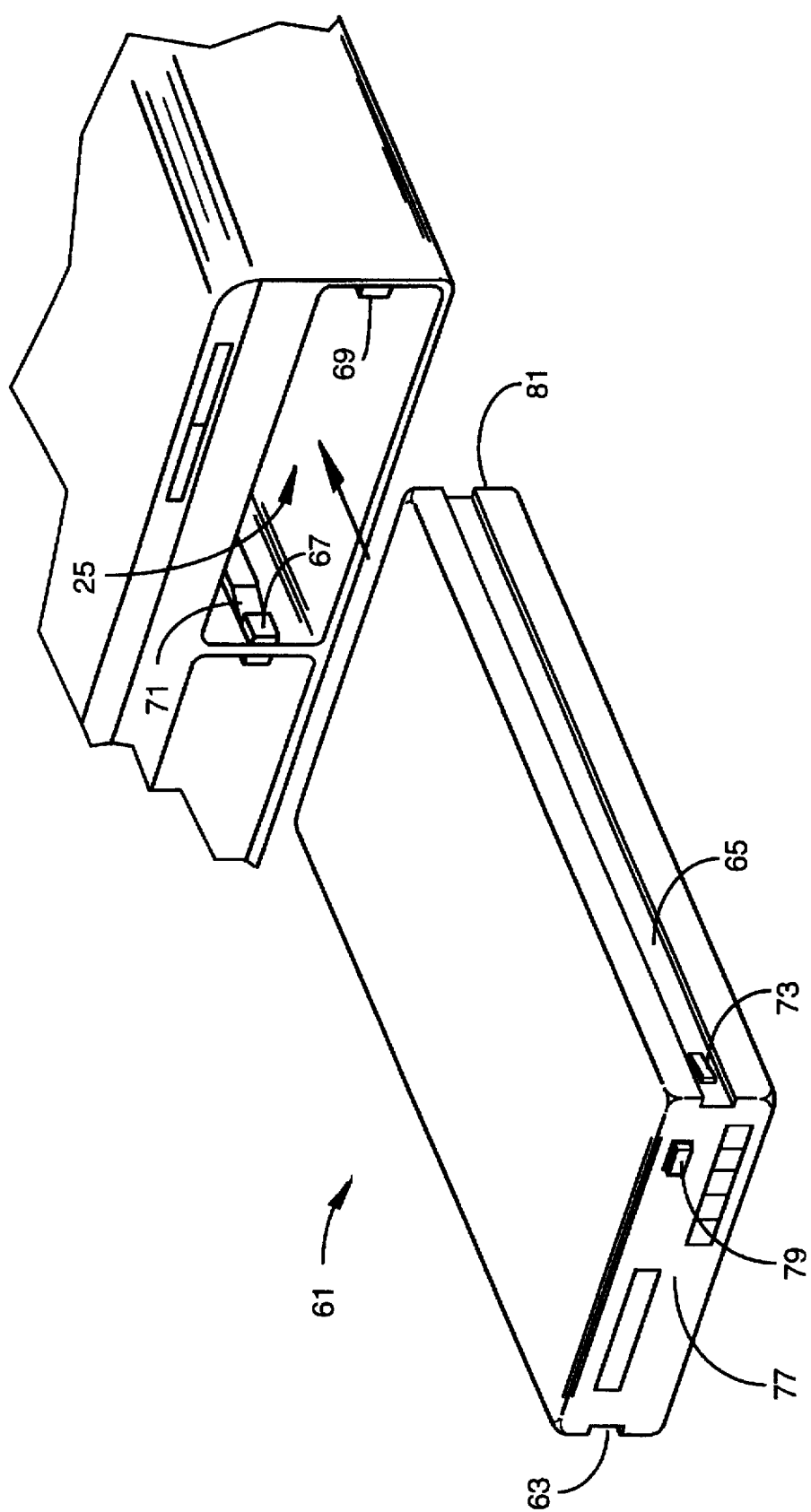
FIG. 3 is an isometric illustration showing a function module according to the present invention associated with a docking bay of the framework of FIG. 1A.

FIG. 3 is an isometric view of a function module 61 according to the invention aligned with module bay 25 of framework 11. Module 61 includes guides 63 and 65 on opposite sides for engaging rails 67 and 69 when module 61 is inserted into bay 25. The module has two spring-loaded detent levers (lever 73 is shown) for engaging detents in guide rails 67 and 69 when the module is fully inserted. Detent 71 is shown in rail 67 in FIG. 3.

Each module bay has a compression spring mechanism engaged by a function module as the module nears full insertion, so there is an outward force on the module when the detent levers engage the detents. Mechanism 75 (FIG. 2) is exemplary. To insert a module one aligns the guides in the module with the guide rails and pushes the module into the module bay until the detents engage. Button 79 on front face 77 of the module is for retracting the detent levers of the module, in which case the spring mechanism ejects the module, much as is the case with some floppy disk drives.

Figure 4:
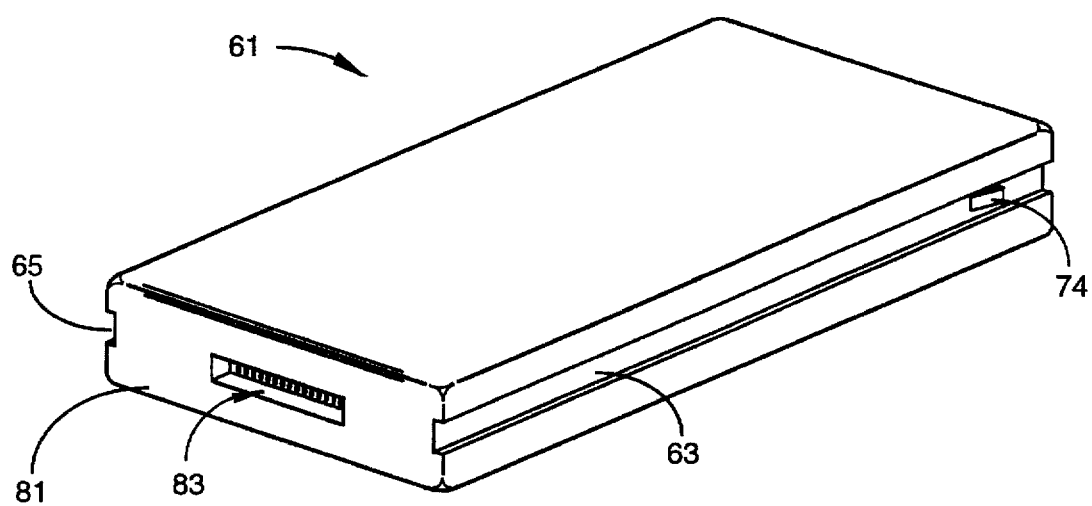
FIG. 4 is another view of a function module according to the present invention.

FIG. 4 is an isometric view of function module 61, showing back face 81 opposite front face 77. The back face includes a recessed female connector receptacle 83 in the preferred embodiment, for mating with male connectors positioned in each pod bay, such as connector 33 in FIG. 1B and FIG. 2. A second detent lever 74 is opposite lever 73 of FIG. 3.

In the embodiment described above, and in many other embodiments, the notebook computer framework of the present invention comprises a frame with module bays and connectors as described above for "plugging in" function modules, power supply units, and other peripheral devices. The framework also comprises display 15, keyboard 17, and an internal bus structure hereinafter termed the Notebus, which is described in additional detail below, in the section titled "Notebus Bus Structure".

The function modules, as represented by module 61 in FIG. 3 and FIG. 4, are provided in a wide variety of different models capable of a wide variety of different functions. For example, framework 11 has no "on-board" CPU, battery power, or system memory. These functions and all other functions are provided by different models of function modules which may be inserted in any one or a combination of the available module bays. Other kinds of function modules that may be inserted include floppy-disk drives, hard-disk drives, "flashcard" memory modules, LAN and modem adapters, Fax modules, specialty modules such as data acquisition modules adapted to specific equipment, and more. The function modules are also described in more detail in the section below titled "Function Modules".

Electronic Architecture

Figure 5:
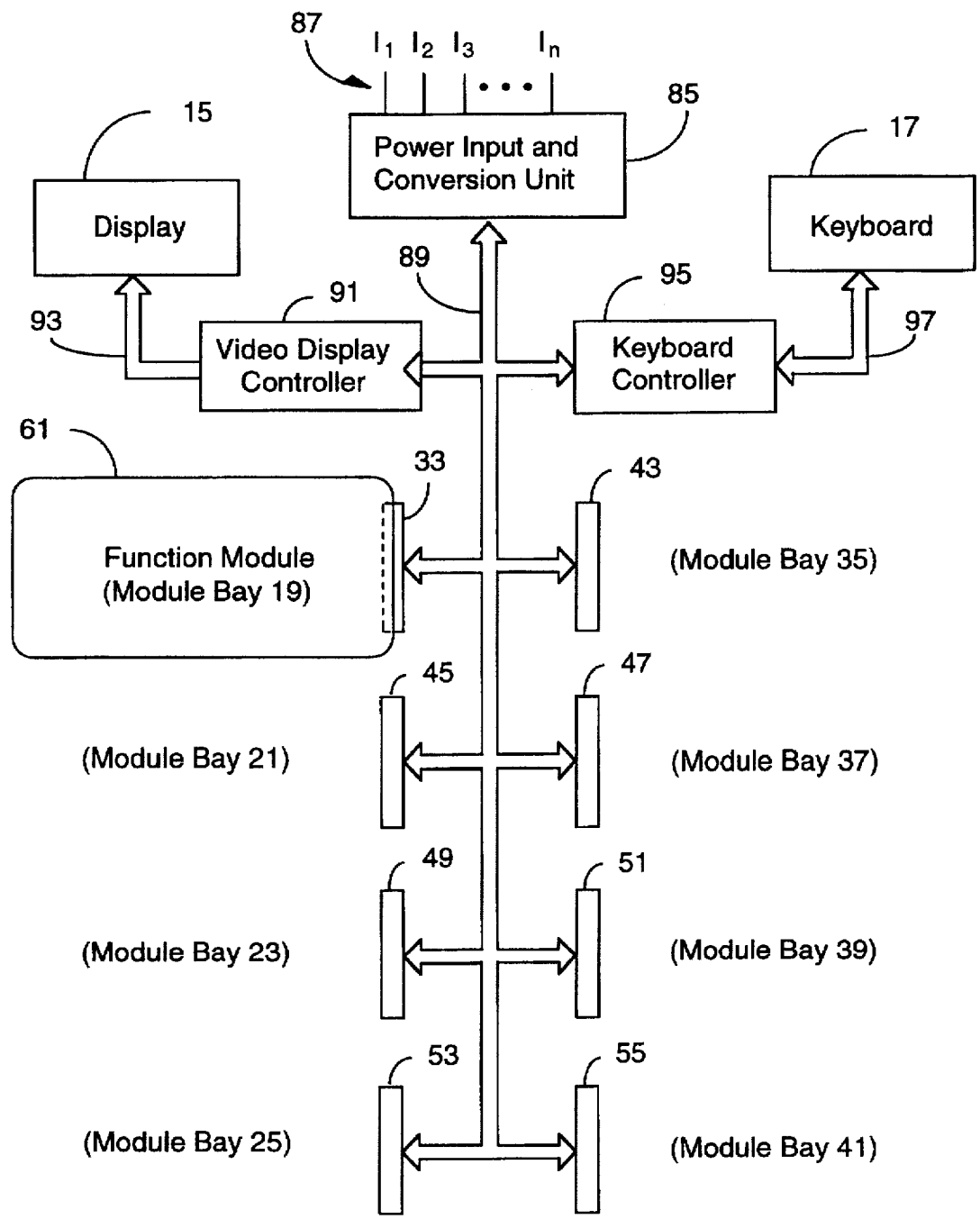
FIG. 5 is a block diagram of a compressed bus and connection to docking bays in a computer framework according to an embodiment of the present invention.

FIG. 5 is a block diagram showing internal elements of Notebook computer framework 11, connected to show the electronic architecture of the notebook computer according to the invention. Power input and conversion unit 85 is housed in back housing 13 (FIG. 1) and has ports 87 for power inputs. Unit 85 senses the input conditions and selects appropriate circuitry to convert the input to the voltages needed to power the other elements of the system. Output from the conversion unit is to Notebus 89, which comprises paths for power as well as for digital information such as data and addresses.

Because there are a wide variety of function modules, as indicated above and described in more detail below, there needs typically to be more than one power line in the Notebus. For example, the notebook computer of the invention comprises hard disk drive modules, and these modules are preferably provided without their own "on board" power source. The motor drive for the hard disk requires a different power (voltage and current) than does a CPU, for example, so there are parallel power lines of differing size and voltage level in the notebus. A typical Notebus will have, for example, a line for 24 V DC, another for 12V DC, and yet another for 5V DC, as well as multiple ground lines.

Notebus 89 connects to a video display controller 91 including Video Random Access Memory (VRAM) which both powers and controls display 15, which in the preferred embodiment is a flat panel display driven by analog driver lines on analog bus 93. Notebus 89 also connects to a keyboard controller 95 which powers and controls keyboard 17 over link 97, accepting keystroke input and converting the input to digital data for transmission on Notebus 89. The keyboard controller may be physically mounted in the keyboard or in framework 11.

Notebus 89 also connects as illustrated in FIG. 5 to each of the module bays, such as bay 19, through connectors, such as connector 33. When a function module, such as module 61, is inserted into a module bays the mating connector in the back of the function module mates with the connector from the Notebus, and circuitry inside the function module is then connected to the Notebus.

Notebus Bus Structure

The Notebus comprises, as stated above, both power and data paths. The digital lines are capable of carrying 32 addresses and conveying data in 32 bit word length. To minimize pin count and routing complexity, addresses and data are multiplexed on a single set of 32 traces in the overall bus structure. One with skill in the art will recognize that this type of bus is what is known in the art as a low-pin-count or compressed bus. In this kind of bus different types of signals, such as address and data signals, share signal paths through multiplexing. For example, the same set of data lines are used to carry both 32-bit addresses and data words of 32-bit length.

In the Notebus of the present invention, some control signals, such as interrupt arbitration signals, may also share the data lines. Typical examples of buses that are exemplary as usable for the Notebus (with the exception of power supply analog lines in the Notebus) are the "S-Bus" implemented by Sun Microsystems, the "Turbochannel" Bus from Digital Equipment Corporation, and buses compatible with the IEEE-488 standard.

The Notebus is a high-speed backplane bus for interconnecting processor, memory and peripheral device modules. The Notebus also supplies standard operating and standby power supply voltages and electrical ground to all module bays.

Function Modules

FIG. 3 and FIG. 4 show, as described above, two different views of a function module according to the present invention. Also as stated above, function modules may have many different functions. There are as many different functions, in fact, as there are possibilities for discrete peripheral devices, plus power and CPU modules. An individual function module is provided for each function, and in each case the function module has a physical size and form compatible with the bays, guide rails, and connectors for "plugging in" to framework 11.

The "face" of a function module, being the exposed face when the module is "plugged in" (see face 77 in FIG. 3) may have elements specific to the type of module. For example, a CPU module may have no indicators or other elements on the front face, while a floppy disc module will typically have an opening for inserting a floppy disk and a "key" or button for releasing and ejecting the floppy disk.

A unique feature of the present invention is that the CPU for the notebook computer is provided as a CPU function module. This provides an ability for a user to tailor the CPU power to the other modules and application for the notebook computer, and an easy upgrade to more powerful CPUs.

Figure 6:
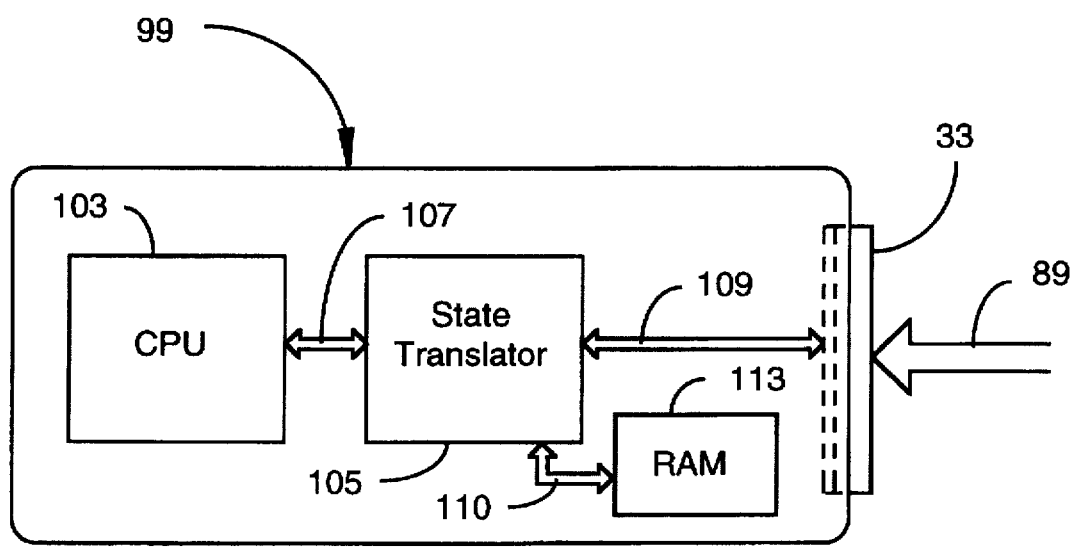
FIG. 6 is a block diagram of a CPU function module according to an embodiment of the present invention.

FIG. 6 is a diagram of a CPU module 99 plugged into a bay in a notebook computer according to the present invention. In this case (referring to FIG. 2) the module is plugged into bay 19 having connector 33. This is exemplary, as the module could just as well be plugged into any open bay of framework 11. By virtue of being plugged into connector 33 or another module connector, internal elements of the CPU module are connected to Notebus 89.

The internal elements for module 99 comprise CPU 103, a state translator 105, and RAM memory 113. CPU 103 may be any of a wide variety of CPUs (also called in some cases MPUs) available in the art, for example Intel 80386 or 80486 models, MIPS, RISC implementations, and many others. CPU 103 communicates with State Translator 105 over paths 107, and State Translator 105 communicates with connector 33, hence Notebus 89, over bus 109 internal to the module, which is an extension of bus 89 when the module is plugged into bus 89.

State translator 105 is a chip or chip set designed to translate commands and requests of the CPU to commands and requests compatible with the Notebus. It was mentioned above that CPU 103 may be one of a wide variety of CPUs, and that Notebus 89 may be any one of a wide variety of compressed buses. It will be apparent to one with skill in the art that there may be an even wider variety of state translators 105 for translating between the CPU and the Notebus. The state translator is theoretically a different device for each possible combination of CPU and Notebus.

RAM memory module 113 comprises conventional RAM chips mounted on a PCB as is known in the art, and connectable to state translator 105 by a plug or connector interface, such as an edge connector. The purpose of having a RAM module "on board" the CPU module is to provide for rapid memory access, which will be much slower if the RAM is made available in a separate module at one of the other module bays. Memory at another module bay is on the Notebus, and will be subject to bus contention and wait states. The plug-in nature of the RAM unit relative to the CPU module allows different amounts of memory to be provided with a CPU module in the notebook computer of the present invention.

As described above, Notebus 89 comprises not only the shared data and address lines, but also power and ground connections for the modules plugged into the various bays. Paths 109 and 107 therefore comprise power and ground lines for CPU 103 and Translator 105.

If, for example, CPU 103 is an INTEL 80486 microprocessor, State Translator 105 will be a translator for accommodating the state machine of the 80486 to the state machine of the Notebus, which may be any one of the buses described above for bus 89, or another compressed bus. There are many equivalent ways a translator may be implemented for the specific case. Given the manufacturers available design information for the CPU and the equivalent information for bus 89, it is within the skill of workers in the art without undue experimentation to implement the translator and the required connections. This is conventional technology. The implementation of the translator on a module with a CPU to plug into a module bay in the notebook computer is unique to the present invention.

In the invention, state translators may be implemented in a single chip set or circuitry set to be capable of translating between a number of CPUs and a number of different bus possibilities. One might, for example, design and implement a translator with the necessary circuitry and intelligence to translate between three different CPUs and three different compressed buses. The state translator could be made hardware or software programmable to select one CPU and one bus from the available selections at some convenient time in the manufacturing cycle, or even at the time of selection of modules to make up a notebook computer.

As an example of a hardware programmable translator, a translator could be built to have certain traces cut as a near final step in manufacture as a way of selecting the CPU and bus pair. Translators could also be programmable by virtue of on-board EPROM or EEPROM devices. As an example of software programmability, translators could be implemented with microprocessor technology and software programmable. A CPU module could be plugged into a connector on a special programming unit, for example, before installation in a notebook computer according to the present invention, and be sent certain commands to set up on board software to translate between the desired CPU and bus. It will be apparent to one with skill in the art that there are many possible variations in the implementation of the translators.

Figure 7:
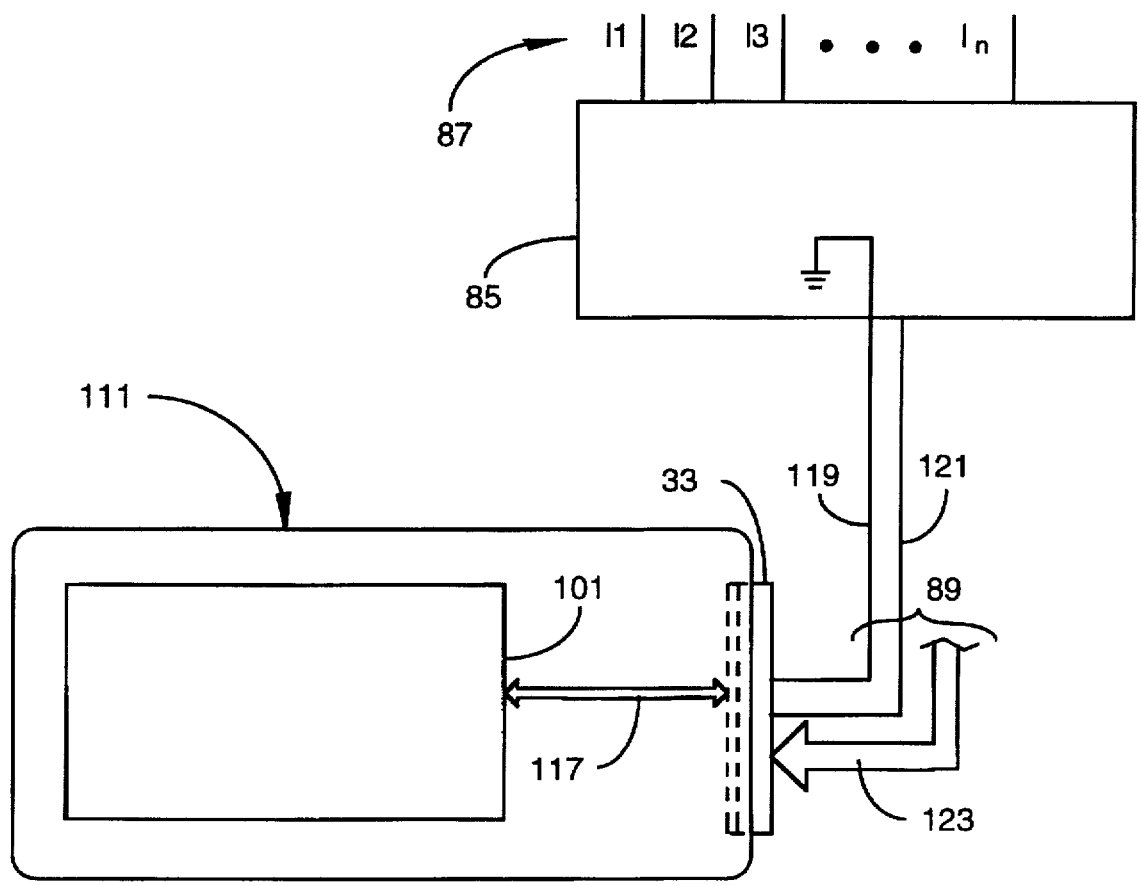
FIG. 7 is a block diagram of a power supply function module according to an embodiment of the present invention, with indication of connections to the internal bus structure and power conversion unit of the computer.

FIG. 7 shows a power module 111 plugged into a bay in the notebook computer according to an embodiment of the present invention. The purpose of a power module is to provide a source of power for the computer, which includes any modules plugged into the module bays. As is common in notebook computers in the art, there may be a battery, typically rechargeable, in framework 11, and the battery may also be replaceable and rechargeable through power input lines 87. In the case of an on-board battery pack, there is the option of using all module bays for other than power packs.

Preferably framework 11, sans function modules, has no power capability other than power plugged into one of input lines 87, which may be converted to the power characteristics needed by the computer and distributed on the power lines of the Notebus. For portability, power is typically supplied by one (or more) power modules 111 plugged into one or more of the module bays.

Module 111 has a battery pack 101 which is connected via lines 117 to (in this case for example) connector 33, and hence to Notebus 89. Because there are several supply lines in the Notebus for supplying power to function modules at different voltage and with different current capability, the power lines in the Notebus for connecting a power module 111 are not the same as the lines for supplying power to a module. There is instead a separate sat of power lines to pins on the module bay connectors, such as connector 33, which connect as input to power input and conversion unit 85, much as do input ports 87.

In FIG. 7, lines 119 and 121 connect power module 11 to conversion unit 85, where the power input from the power module is sensed and treated as a power source, much as is done for power input lines 87. This power is converted to the needed voltages and current capabilities, and put back out on the power supply output lines to the module bays. In FIG. 7 line 119 is ground, and arrow 123 represents all of the data/address, control, and power output lines to the module bays. Lines represented by arrow 123, plus lines 119 and 121 are Notebus 89. Although not shown in FIG. 7, there are connections for line 119 and for line 121 to each of the module bay connectors.

Power modules such as module 111 may be plugged into a connector on a charging module separate from the notebook computer, using the same connector used for plugging into the Notebus via a module bay of framework 11, and recharged for later use with a modular notebook computer according to the invention. This allows a user to keep spare power modules ready for use, and to recharge modules without connecting the computer itself to a charging unit. Moreover, the provision of power modules allows a user to provide more or less portable time to the notebook computer by using one or more than one power module.

Figure 8:
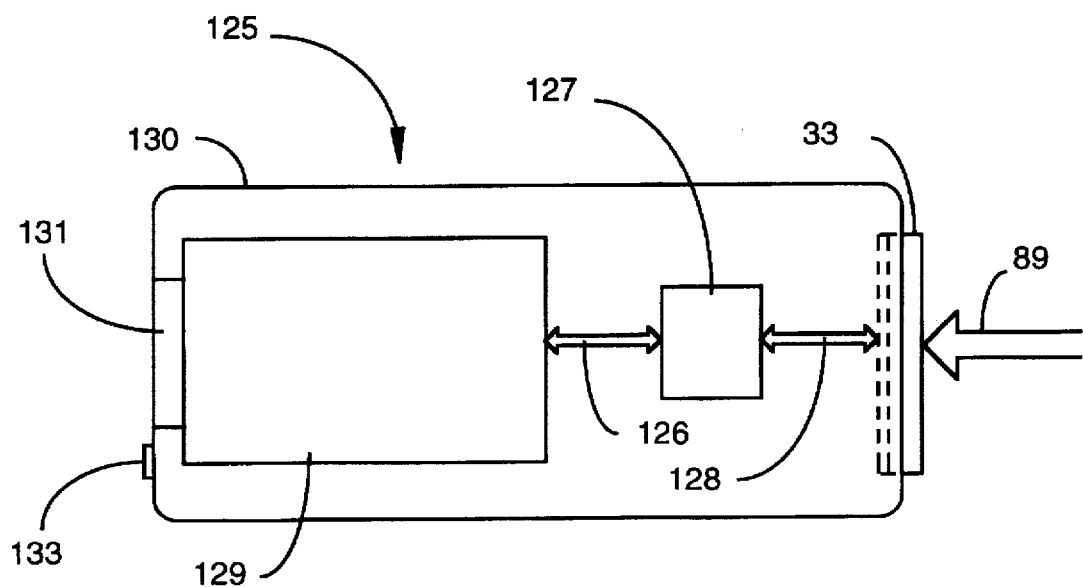
FIG. 8 is a block diagram of a floppy disk drive function module used in the invention.

FIG. 8 shows a floppy disk drive (FDD) module 125 plugged into a module bay in a notebook computer according to an embodiment of the present invention. Module 125 comprises a conventional FDD unit 129 for nominal 3.5 inch disks with conventional circuitry mounted in a case 130 to provide a module with guides, latches, and a connector matable with connector 35 to be able to plug into a module bay in the notebook computer of the present invention. The case comprises an opening 131 for inserting and withdrawing a floppy disk, and an eject button 133 for ejecting a floppy disk.

A controller 127 communicates with unit 129 over lines 126 and with connector 33 (hence Notebus 89) over lines 128. The unit also derives power from the appropriate pins on connector 33, but these pins and lines are not shown. Controller 127 is an ASIC chip or chip set for translating between the notebus and the FDD unit. Given the data storage standards of the FDD unit and the characteristics of bus 89, it is within the scope of workers with ordinary skill in the art to implement controller 127 without undo experimentation.

Figure 9:
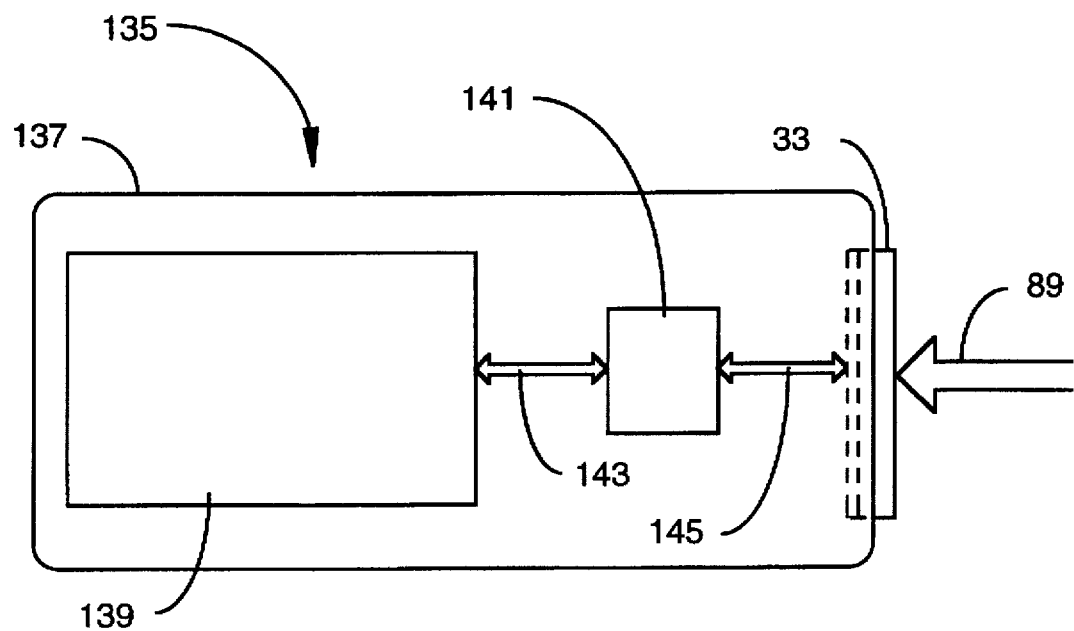
FIG. 9 is a block diagram of a hard disk drive module used in an embodiment of the invention.

FIG. 9 shows a hard disk drive (HDD) module 135 according to an embodiment of the present invention plugged into bus 89 in a module bay of framework 11. HDD module 135 comprises a conventional HDD unit 139 mounted in a case 137 to be compatible with plugging into a notebook computer according to the present invention. As in the case of the FDD module described above, a controller 141 is provided to translate between Notebus 89 and the HDD unit. Controller 141 communicates with HDD unit 139 over lines 143, and with connector 33 over lines 145. Connector 33 is exemplary of any one of the module connectors in the notebook computer.

Given the characteristics of HDD unit 139 and of Notebus 89, it is within the skill of workers in the art to implement controller 141 without undue experimentation. Power line connections are not shown. In implementing controller 141 there are several protocols that may be used. One is the ST506 standard known in the art. Another is the IDE standard known in the art. Yet another is an enhanced IDE, called EIDE, known to the inventors, and the subject of a separate patent application to be filed. In the EIDE protocol, there may be multiple IDE devices daisy-chained and addressed as secondary IDE devices with an additional select number.

Figure 10:
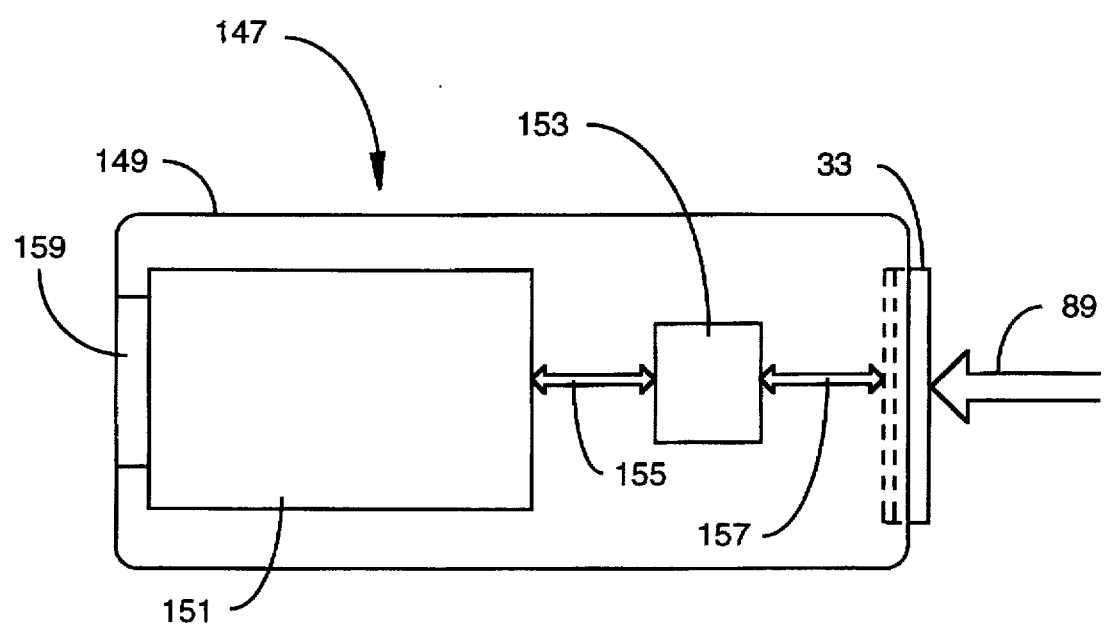
FIG. 10 is a block diagram of a "flash card" memory module according to an embodiment of the present invention.

FIG. 10 shows a "flash card" memory module 147 plugged into connector 33 of the notebook computer of the invention. "Flash cards" are RAM memory cards known in the art pluggable into typically parallel ports o make connection with internal bus structures of a computer. Module 147 comprises a conventional "flash card" 151 mounted in a case 149 compatible with the module bay of a notebook computer according to the present invention.

As in cases described above, a controller 153 is needed to accomplish communication between the memory structure of the "flash card" and bus 89. Controller 153 communicates with "flash card" unit 151 over lines 155 and with connector 33 over lines 157. There may optionally be an opening 159 in case 149 and a connector (not shown) within unit 151 for inserting and withdrawing flash cards, so relatively large collections of data may be plugged in as desired. Alternatively the interface may be the modular interface afforded by the plug-in module 147. Again, given the known characteristics of the flash card and of bus 89, implementation of the controller is a matter within the skill of workers in the art.

Figure 11:
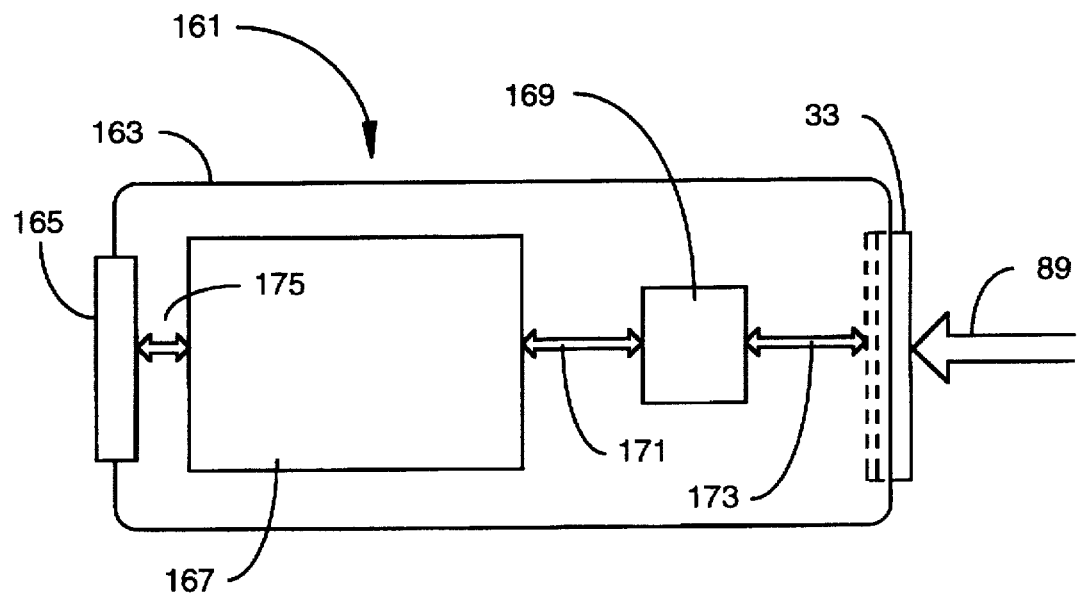
FIG. 11 is a block diagram of a LAN module according to an embodiment of the present invention.

FIG. 11 shows a LAN module 161 plugged into connector 33 of a notebook computer according to an embodiment of the present invention. In the embodiment shown in FIG. 11 a conventional LAN card, such as an Ethernet card, is mounted in a case 163 to be compatible with plugging into a module bay of a notebook computer according to an embodiment of the present invention.

LAN card 167 communicates with a conventional connector 165 in the face of the case of module 161 that is exposed when the module is plugged into a bay. This is a conventional connector of the sort known in the art for connecting computers on a network.

Within module 161, in a first alternative, conventional LAN card 167 interfaces to a controller 169 communicating over lines 171 and 173, and the controller translates between bus 89 and the conventional LAN card. In a second alternative, a LAN card is provided with the translation built in, so no separate controller is needed. The first alternative is preferable.

Figure 12:
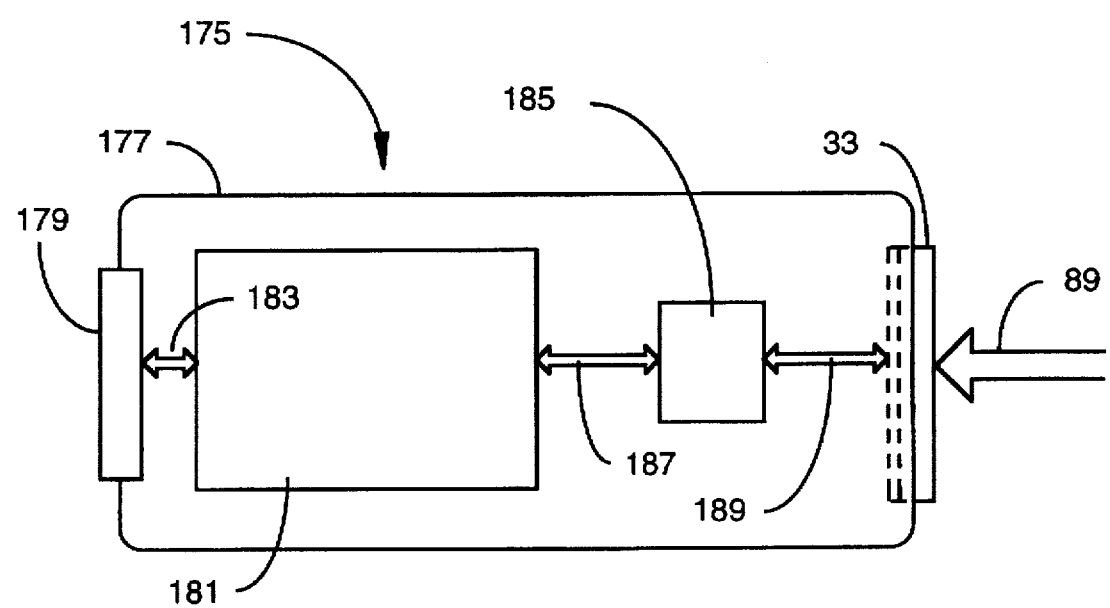
FIG. 12 is a block diagram of a modem module according to an embodiment of the present invention.

FIG. 12 shows a modem module 175 plugged into connector 33 in a bay of a notebook computer according to an embodiment of the present invention. Modem module 175 comprises a conventional modem card 181 mounted in a case 177 to be compatible with plugging into a module bay. In this case, and other cases above, where the term "conventional" is used in conjunction with a card or unit, it is meant that the circuitry and function is conventional. The size may be adjusted to be compatible with a module case for plugging into a bay of a notebook computer according to the present invention.

Modem card 181 connects over lines 183 to a telephone interface 179, which may comprise more than one "jack" so a hand set may also be connected. Card 181 communicates to Notebus 89 over lines 187 and 189 through controller 185, which translates between the conventional card and the compressed bus. Alternatively, the translation components may he implemented on a single card along with the modem circuitry.

Figure 13:
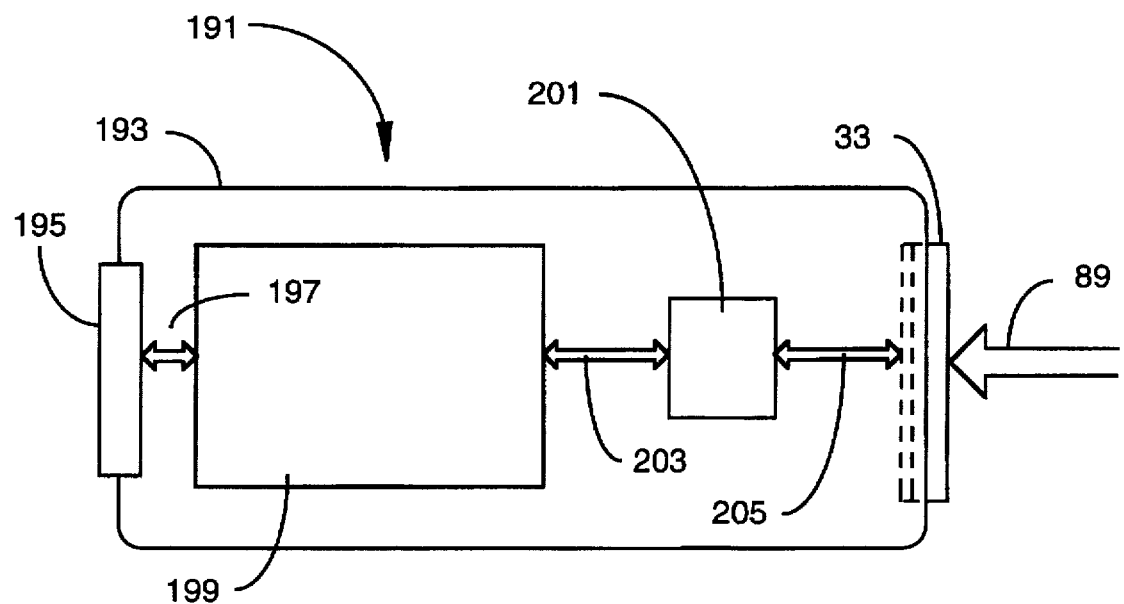
FIG. 13 is a block diagram of a FAX module according to an embodiment of the present invention.

FIG. 13 shows a FAX module 191 plugged into connector 33 of a module bay in an embodiment of the present invention. Module 191 comprises a conventional FAX card 199 mounted in a case 193 to be compatible with plugging into a module bay in the present invention. Fax card 199 communicates over lines 197 with a telephone interface 195, which may, as in the case of the modem module described above, have more than a single telephone "jack".

A controller 201 provides an interface for the conventional FAX card between the card and Notebus 89 over lines 203 and 205. Alternatively, the controller may be implemented on the same card as the FAX circuitry. In yet another alternative, the FAX capability and the modem capability described above may be implemented into a single module.

Figure 14:
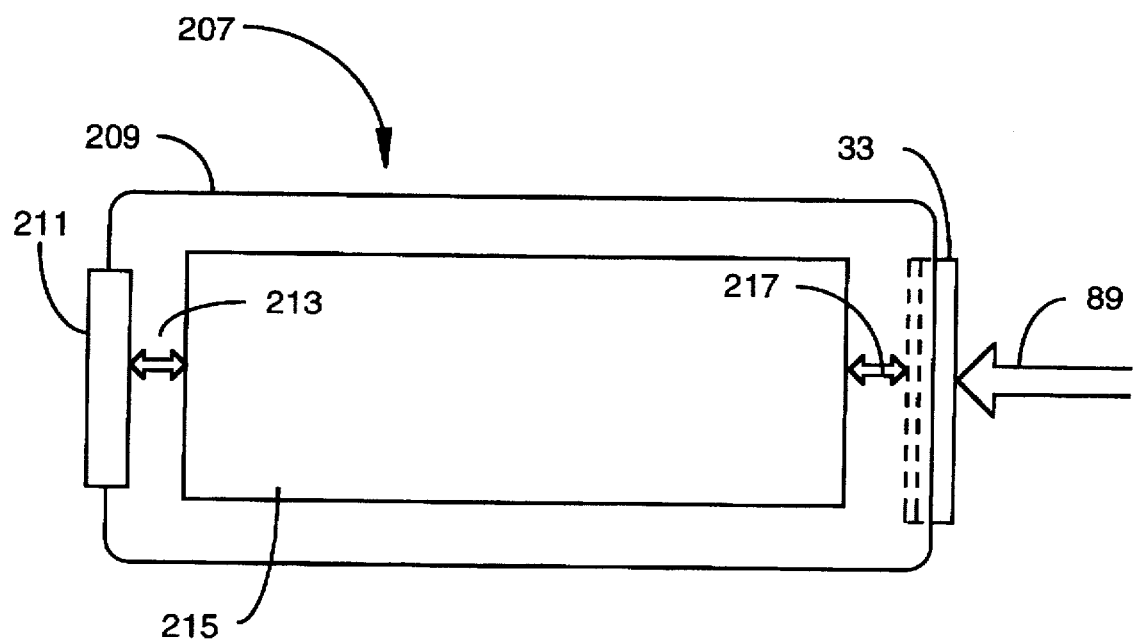
FIG. 14 is a block diagram of a data acquisition module according to an embodiment of the present invention.

FIG. 14 shows a specialty data acquisition module 207 plugged into connector 33 in a module bay in a notebook computer according to an embodiment of the present invention. Module 207 comprises a circuit card 215 mounted in a case 209 to be compatible with plugging into a module bay. Card 215 communicates over lines 213 to an interface 211 which may comprise one or several acquisition leads for connecting to outside equipment. For example, a data module may be provided for following the output of the vertical and horizontal sweep of an oscilloscope, and would have at least two input leads; one for the vertical and one for the horizontal sweep.

Card 215 communicates over lines 217 to connector 33, hence Notebus 89. The circuitry on card 215 is designed to digitize the input if the input is analog, and to be compatible with Notebus 89. Given the characteristics of signals to be measured and the characteristics of Notebus 89, implementation of such a card is within the ordinary skill in the art.

The embodiments of the present invention described above relate primarily to notebook type computers. However, the invention has broader applications. The principles of the invention are also applicable to portable computers known as palmtop computers, and further embodiments are described below.

Figure 15A:
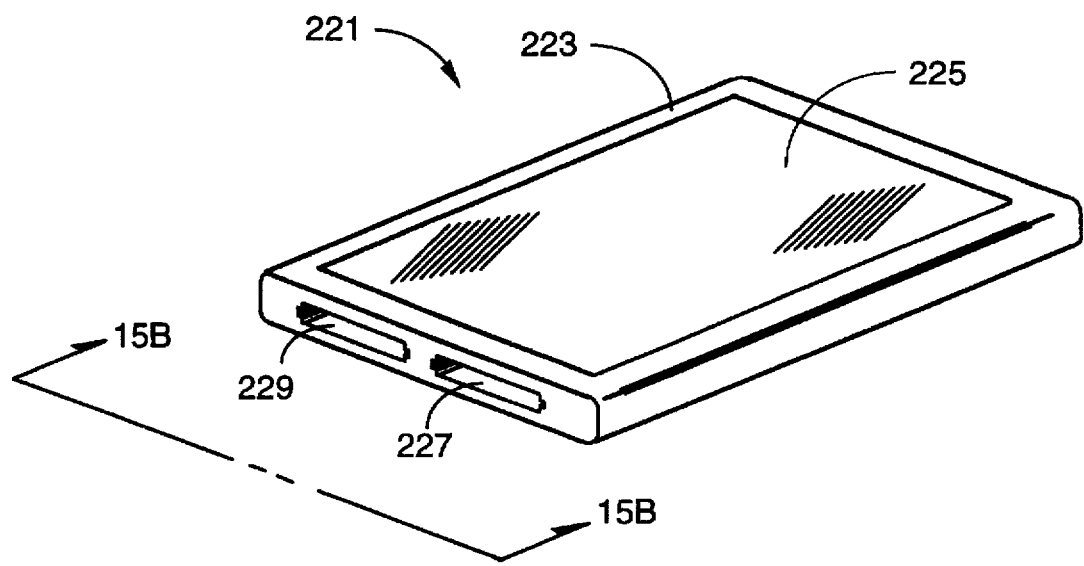
FIG. 15A is an isometric view of a modular palmtop computer framework according to an embodiment of the present invention.

FIG. 15A is an isometric view of a modular palmtop computer 221 according to an embodiment of the invention. Computer 221 is approximately the size of one-half a standard piece of paper (approximately 5.5 inches by 8.5 inches) and in a preferred embodiment comprises a planar array of four Personal Computer Memory Card International Association (PCMCIA) Type II module bays in a case 223.

In this embodiment case 223 has a combination I/O area 225 implemented on one side of computer 221, comprising a display overlaid with a touch sensitive planar structure. In other embodiments, the display may be a flat-panel display pivoted to the case, or a separate monitor in communication with case 223. The touch screen provides a "softkey" operation in conjunction with interactive control logic. In a preferred embodiment of the invention, the control logic resides in static or dynamic memory within case 223 but may also be part of an installed PCMCIA-type peripheral. A power unit (not shown) is enclosed within case 223 for converting electrical input on a wide variety of standards to the form required by the computer. For example, there is a port (not shown) for connecting to a standard household outlet, rated at 120 V., 60 Hz, alternating current. The power unit converts the input to outputs as needed by the computer bus and function modules. There are also input ports for 6 V. DC, 12 V. DC, 9 V. DC, and others, and the power unit in one embodiment of the present invention is capable of recognizing the input characteristics by sampling, and switching to proper onboard circuitry to utilize the input.

In the embodiment of the invention shown by FIG. 15A, two module bays 227 and 229 are provided on one side of case 223. There are two more module bays along the other side of the case opposite the module bays shown. In other embodiments bays may open to other edges of the case. The configuration provides a good balance between the need to stay small and simple, and to also have adequate versatility. In alternative embodiments other module configurations may be used, such as PCMCIA Type III, and others. In the alternative configurations the arrangement of the planar array of modules may vary as well.

Figure 15B:
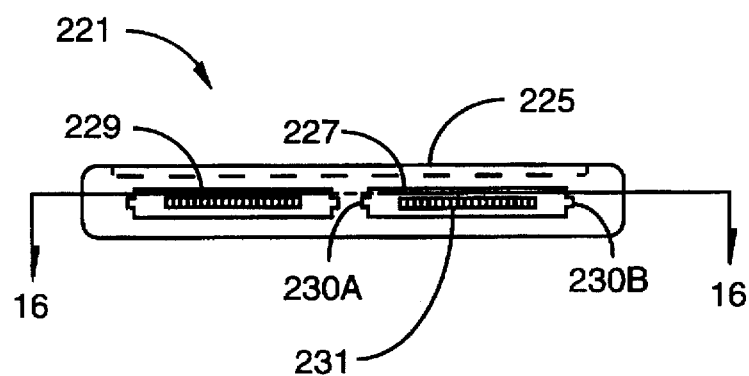
FIG. 15B is a view of the computer framework of FIG. 15A from one side from the vantage of line 15B—15B on FIG. 15A.

FIG. 15B is a view of computer 221 in the direction of arrows 15B—15B of FIG. 15A. I/O area 225 is located on top of case 223. Module bay 227 has a set of guide slots 230A and 230B. The guide slots are to position and guide a PCMCIA module card inserted into the module bay. Each module bay in this embodiment is configured to PCMCIA dimensional and connective standards and secures the fitted PCMCIA cards according to those standards. In this embodiment of the present invention, case 223 has bays configured to PCMCIA type 2, revision B standard. In another embodiment of the invention, the case may have other types of PCMCIA module bays, or bays configured to one or another proprietary standard.

Each module bay has a bus connector, such as connector 231. In this embodiment, connector 231 is a standard PCMCIA connector that accepts PCMCIA cards and is electrically connected to the palmtop's internal bus. It will be apparent to those with skill in the art that there are a number of equivalent ways to connect a function module.

Figure 16:
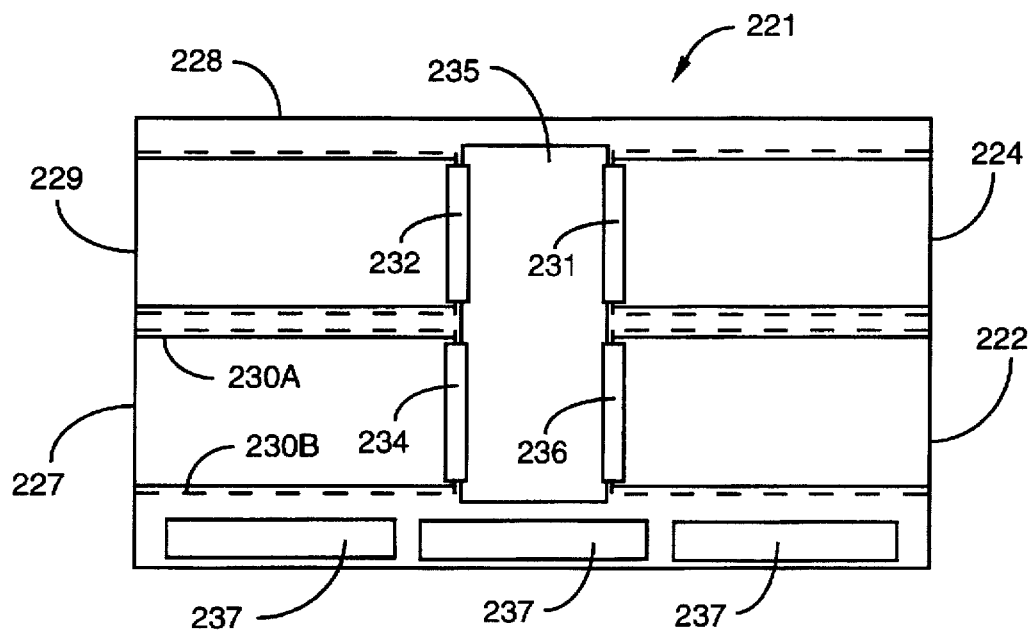
FIG. 16 is a sectioned plan view of the computer framework of FIG. 15A taken along section line 16—16 of FIG. 15B.

FIG. 16 is a simplified plan sectional view of computer 221 taken according to section line 16—16 of FIG. 15B. Frame 228 frames four PCMCIA module bays 222, 224, 227 and 229 arranged in a planar array. A printed circuit board structure 235 is fastened and positioned down the center of frame 228, and connectors 231, 232, 234 and 236 are connected to the printed circuit board structure and present their pin structure outward toward the respective bay areas. In the presently described embodiment, the internal connectors are male connectors, but this is not a requirement of the invention.

Slots 230A and 230B serve to guide a PCMCIA-type card into module bay 227, and similar slots are located in each of the other module bays shown as dotted lines in the sectional view. A set of three AA batteries 237 are located generally in the plane of the module bays and provide a portable power means in one embodiment. In another embodiment, outside power sources may power computer 221 as described above.

Figure 17:
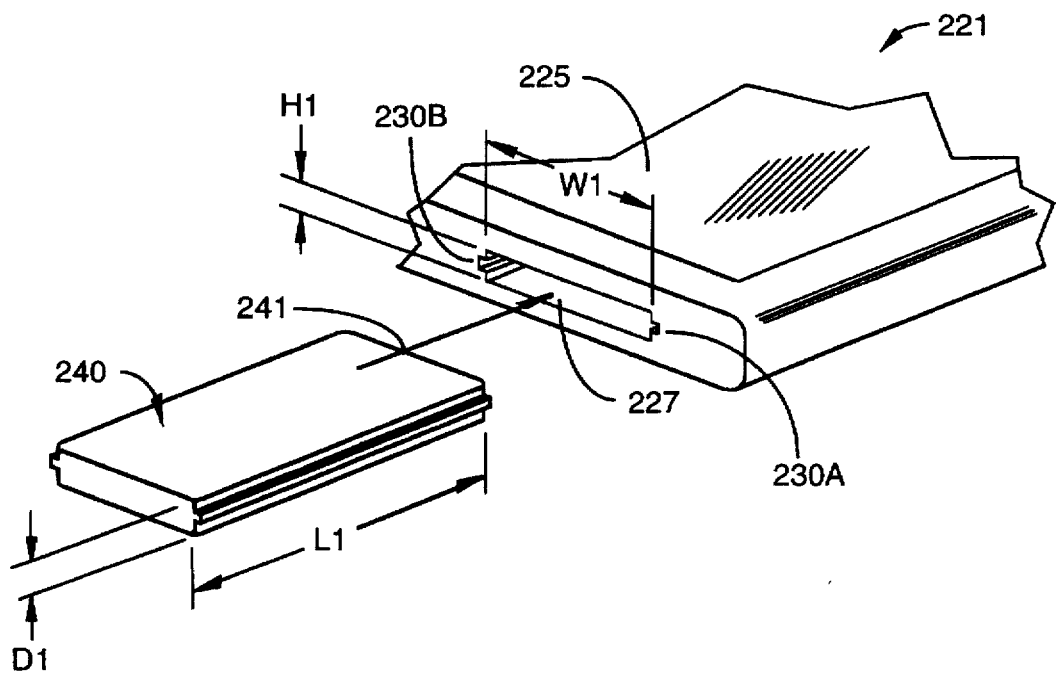
FIG. 17 is an isometric illustration showing a function module and a dedicated docking bay in an embodiment of the present invention.

FIG. 17 is a partial isometric view of a function module 240 according to an embodiment the invention, aligned with module bay 227 of computer 221. Arrow 241 shows the direction of insertion of the function module. I/O area 225 is implemented on top of case 223 in a plane parallel with the plane of the module bays. Module 240 is a Type 2 PCMCIA card and has a thickness D1. The opening of module bay 227 has width W1 and height H1. The length of function module 240 is L1. In this embodiment of the present invention, these dimensions conform to PCMCIA industry standards. In an alternative embodiment of the present invention, module bay 227 may change in dimension to accommodate other standard or proprietary modules.

Module bay 227 engages function module 240 in the full inserted position according to PCMCIA standards. In another embodiment of the invention, detents may be provided similar to those in FIG. 3 for the larger notebook computer embodiment. There are a number of ways known in the art to position and secure a small module. Securing a module may also be accomplished by other means, such as clamping or wedging and/or closing retaining mechanisms.

Figure 18:
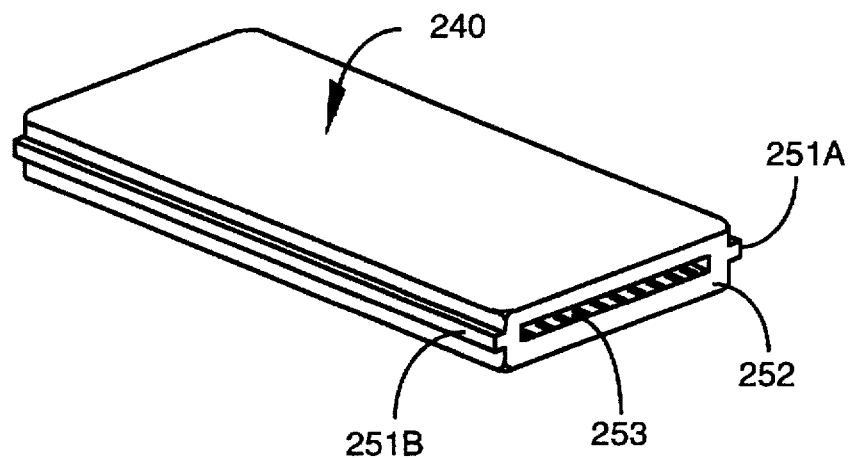
FIG. 18 is another view of a function module according to an embodiment of the present invention.

FIG. 18 is an enlarged isometric view of function module 240 according to Type 2 PCMCIA standards. Back face 252 includes a female connector 253 for mating with a male connector positioned in each module bay, such as connector 231 in FIG. 15B and FIG. 16. Connectors 231 and 253 are PCMCIA connectors and interface according to that industrial standard. Guide 251A and 251B are sized according to the PCMCIA standards.

Function modules are provided in many models capable of a wide range of functions. For example, computer 221 in one embodiment has no onboard CPU or system memory.

These functions are provided by function modules that may be inserted in any one of the available module bays. Other kinds of function modules that may be inserted include I/O system modules that provide speech-based, pen-based or keyboard based input. There are also floppy-disk drives, hard-disk drives, flashcard memory modules, LAN and modem adapters, Fax modules, specialty modules such as data acquisition modules adapted to specific equipment, specialty video modules, modules to adapt scanner periherals to the computer, telephone adapters, and more. In the case of I/O modules, necessary software, and in some cases firmware and hardware, may be connected to the internal bus structure by the insertion of a module. For example, a module is provided in one embodiment comprising an induction coil and a controller for decoding signals received via a varying magnetic field and providing code to the computer's internal bus. The varying magnetic field is produced by a stand-alone keyboard wherein the keystrokes are coded and transmitted as signals on the field.

In another embodiment, a similar module provides for communication from an auxiliary pen-based input pad. In yet another embodiment, a plug-in module provides a microphone, DSP circuitry, and necessary software to accept input from a user by voice, and to convert the voice input to machine-readable code. Provision of the necessary software and circuitry in these instances in module form provides for maximum flexibility an upgradability for modular systems according to the invention.

Electronic Architecture

Figure 19:
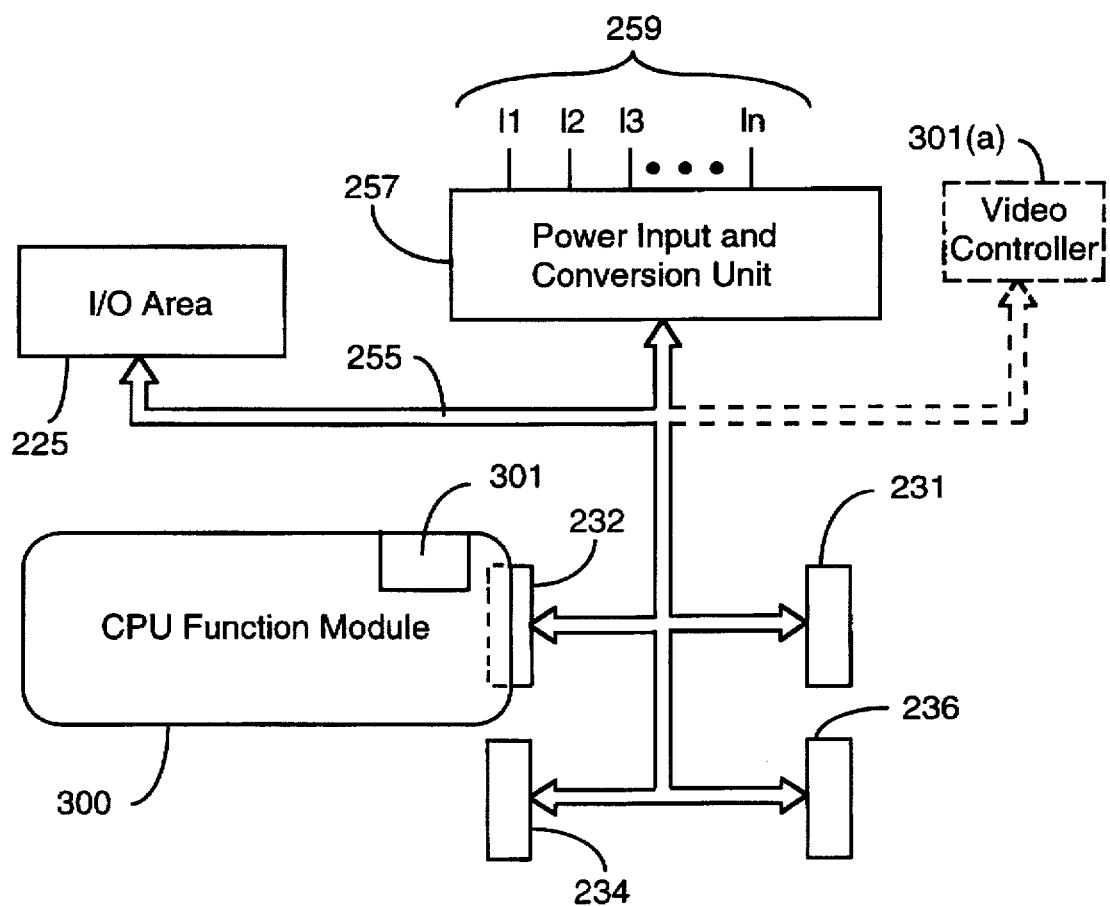
FIG. 19 is a block diagram of a compressed bus and connection to docking bays in a computer framework according to an embodiment of the present invention.

FIG. 19 is a block diagram showing internal elements of palmtop computer 221, connected to show the electronic architecture of the modular computer according to an embodiment of the invention. A power input and/or conversion unit 257 is housed in case 223 (FIG. 15A) and has ports 259 for power inputs. Power input may be from AA batteries 237 (FIG. 16) or from an optional conversion unit via outside electrical sources. Conversion unit 257 senses the input conditions and selects appropriate circuitry to convert the input to the voltages needed to power the elements of the system. Output from the conversion unit is to bus 255, which comprises paths for power as well as for digital information such as data and addresses.

Because there are a wide variety of function modules, as indicated above and described in more detail below, there needs typically to be more than one power line in bus 255. For example, computer 221 may utilize hard disk drive modules, and these modules are preferably provided without onboard power sources. The motor drive for a hard disk requires a different power configuration (voltage and current) than does a CPU, for example, so there may be parallel power lines of differing size and voltage level in bus 255. Bus 255 may have a line for 24V DC, another for 12V DC, and yet another for 5V DC, as well as perhaps multiple ground lines.

Bus 255 connects I/O area 225 and transmits video signals from a video controller. The video controller may be integral to a function module, which is shown as video controller 301 in a CPU function module 300, or implemented in the case, shown as optional video controller 301(a). As described above in a preferred embodiment of the present invention, I/O area 225 is a combination display with an overlaid touch sensitive screen. In another aspect, the I/O area may comprise an active-matrix display, in which case, dedicated analog driver lines from video controller 301 connect to the display. I/O area 225 may also comprise a conventional LCD display wherein I/O control logic is a function of an installed and dedicated I/O peripheral modules. In an alternative embodiment, video controller 301 is built into case 223 (FIG. 15A), and connected directly to bus 255, similar to the modular notebook computer described above.

Bus 255 connects to each of module bays 222, 224, 226 and 227 (FIG. 16) through connectors 232, 234, 236 and 231. When a function module, such as CPU module 300, is inserted into a module bay, female connector 253 (FIG. 18) mates with the respective male connector 232 located in that module bay, and circuitry inside the CPU module is then connected to bus 255.

Palmtop Function CPU Module

The onboard video controller 301 built into CPU function module 300 is a unique feature in one aspect of the present invention. A user is provided an ability to tailor the CPU power and type of video controller to the other modules and applications for palmtop computer 221. This provides a simple means for upgrading by switching CPU function modules. Video signals are local to the CPU, which increases system performance.

Figure 20:
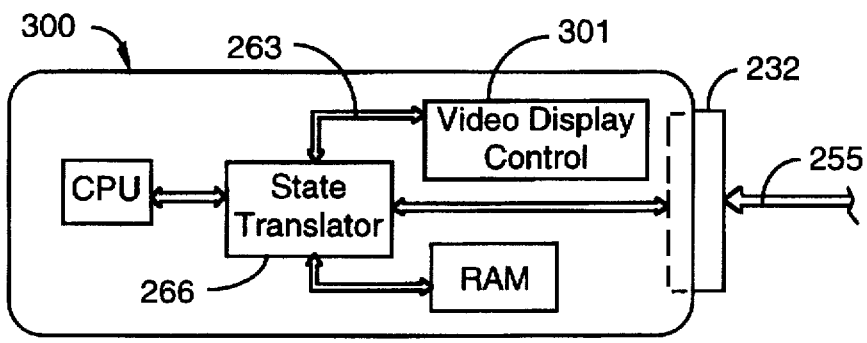
FIG. 20 is a block diagram of a CPU function module according to an embodiment of the present invention.

FIG. 20 is a more detailed diagram of CPU module 300 for computer 221. CPU module 300 is similar in function to CPU module 99 (FIG. 6), except for the addition of video controller 301. Onboard video controller 301 is bus connected by line 263 to a state translator 266. In this embodiment of the invention, the state translator is configured to transmit and receive video signals and commands over bus 255 via connector 231 as well as other functions as described above.

Other Aspects and Features

The embodiments of the present invention described above specifically address notebook-type and palmtop-type computers. The embodiment described below addresses yet another aspect of the palmtop type computers.

Figure 21:
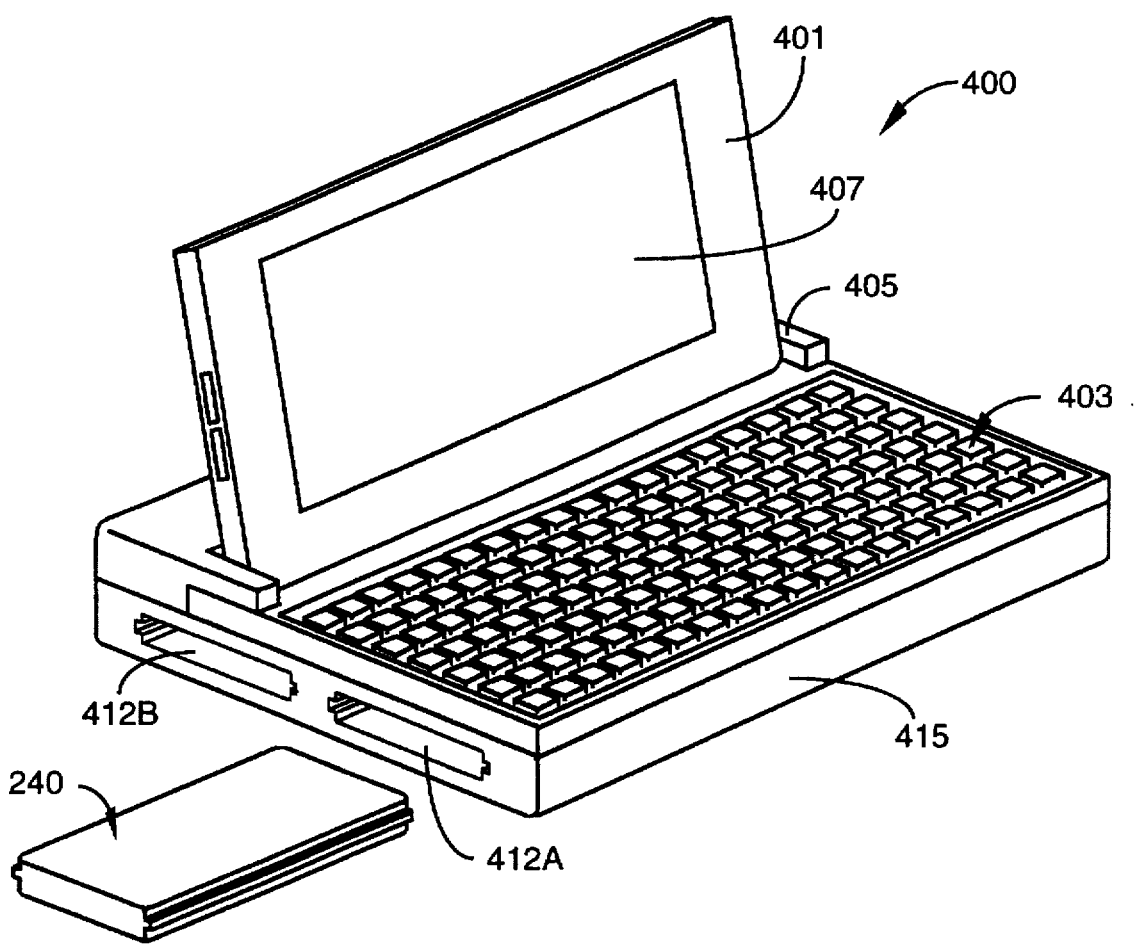
FIG. 21 is an isometric drawing of modular palmtop computer according to another embodiment of the present invention.

FIG. 21 is an isometric drawing of another embodiment of the present invention. Computer 400 comprises an attached pivotable display case 401 and a fixed keyboard 403. The display case rotates about a hinge 405 and closes in a fixed detented position above the keyboard. Display case 401 comprises a flat-panel display 407. There are two PCMCIA-type module bays 412A and 412B on one side of the case, and two more (not shown) on the side opposite. The four PCMCIA module bays are arranged in a planar array as described above. A frame 415 contains a bus structure (not shown) that interconnects all aspects of the PCMCIA type module bays to computer 400 as described above. In this embodiment of the present invention, a standard keyboard controller (not shown) enclosed in frame 415 connects keyboard 403 to the internal bus structure.

Recognizing that in many embodiments of the present invention the physical footprint is much smaller than a full-sized keyboard, it is deemed desirable to have a full-sized keyboard usable with small portable computers according to various embodiments. Toward that end, a flexible keyboard is disclosed below, along with a system of communication allowing the flexible keyboard to communicate with modular portable computers without the limitations of a cable connection.

A Flexible Keyboard with Inductive Coupling

Figure 22A:
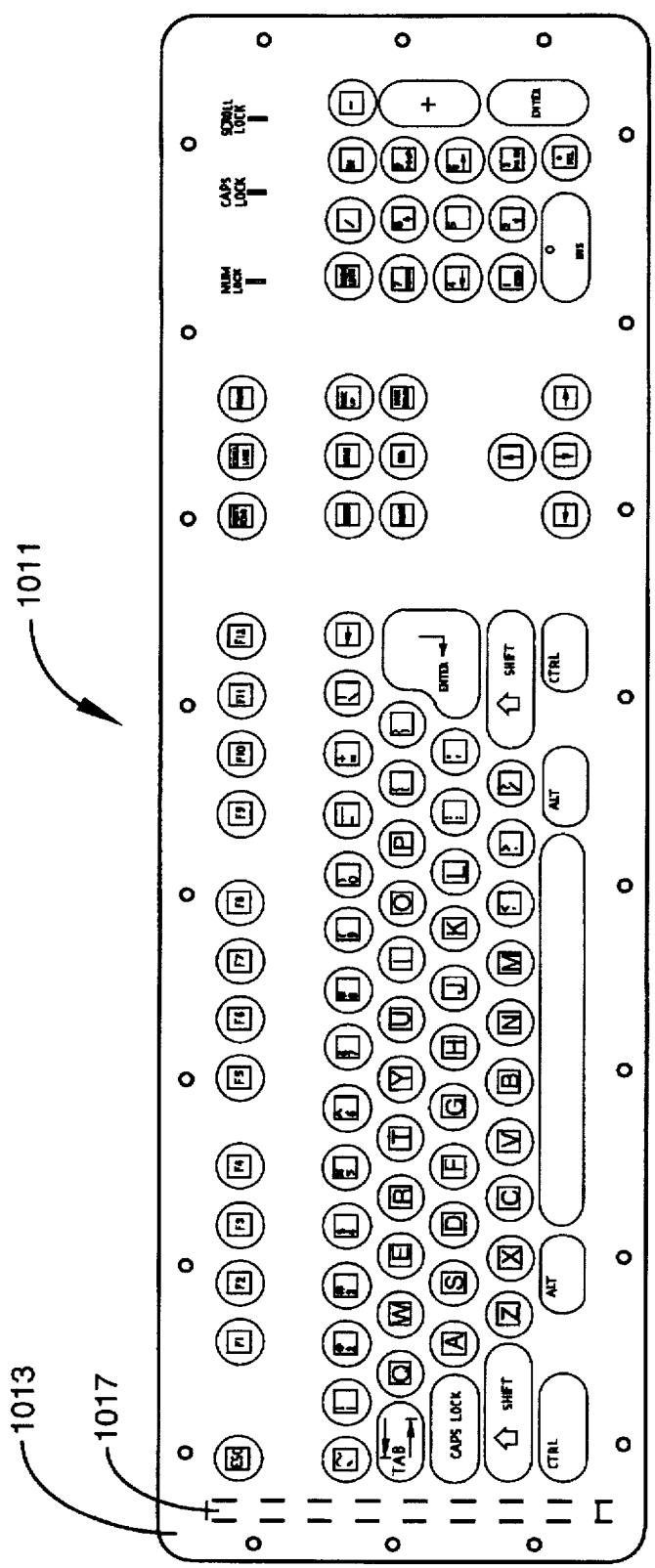
FIG. 22A is a plan view of a flexible, roll-up keyboard according to the present invention.
Figure 22B:
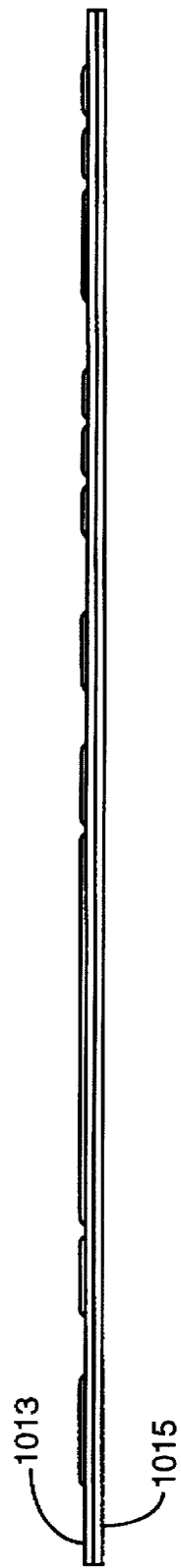
FIG. 22B is an elevation view of FIG. 22A.

FIG. 22A is a plan view of a flexible, roll-up keyboard 1011 according to the present invention. FIG. 22B is an elevation view of FIG. 22A. In the embodiment shown by FIG. 22A, the keyboard has a layout according to the popular "IBM advanced" format. The flexible keyboard of the invention can be implemented in any convenient format. In this embodiment the dimensions are about 50 cm. long and 20 cm. wide.

The keyboard is formed by two molded layers of flexible material, such as polyurethane, although there are a number of other suitable materials, among them natural rubber and several types of synthetic rubber. An upper layer 1013 has shaped pads for keys, and a lower layer 1015 has electrically conductive traces forming circuitry for communicating keystrokes to control circuit module 1017 located in a pocket between the layers. A battery may also share the pocket in some embodiments, or be carried in a similar pocket elsewhere between the layers.

The two flexible layers fasten together in the embodiment of FIG. 22A and FIG. 22B by flexible appendages from one layer "snapping" into receptacles in the other, which provides for relative movement between the layers when the keyboard is rolled up for transport or storage. Details of a key cell, traces, layer attachment, and so forth are provided further below.

Figure 22C:
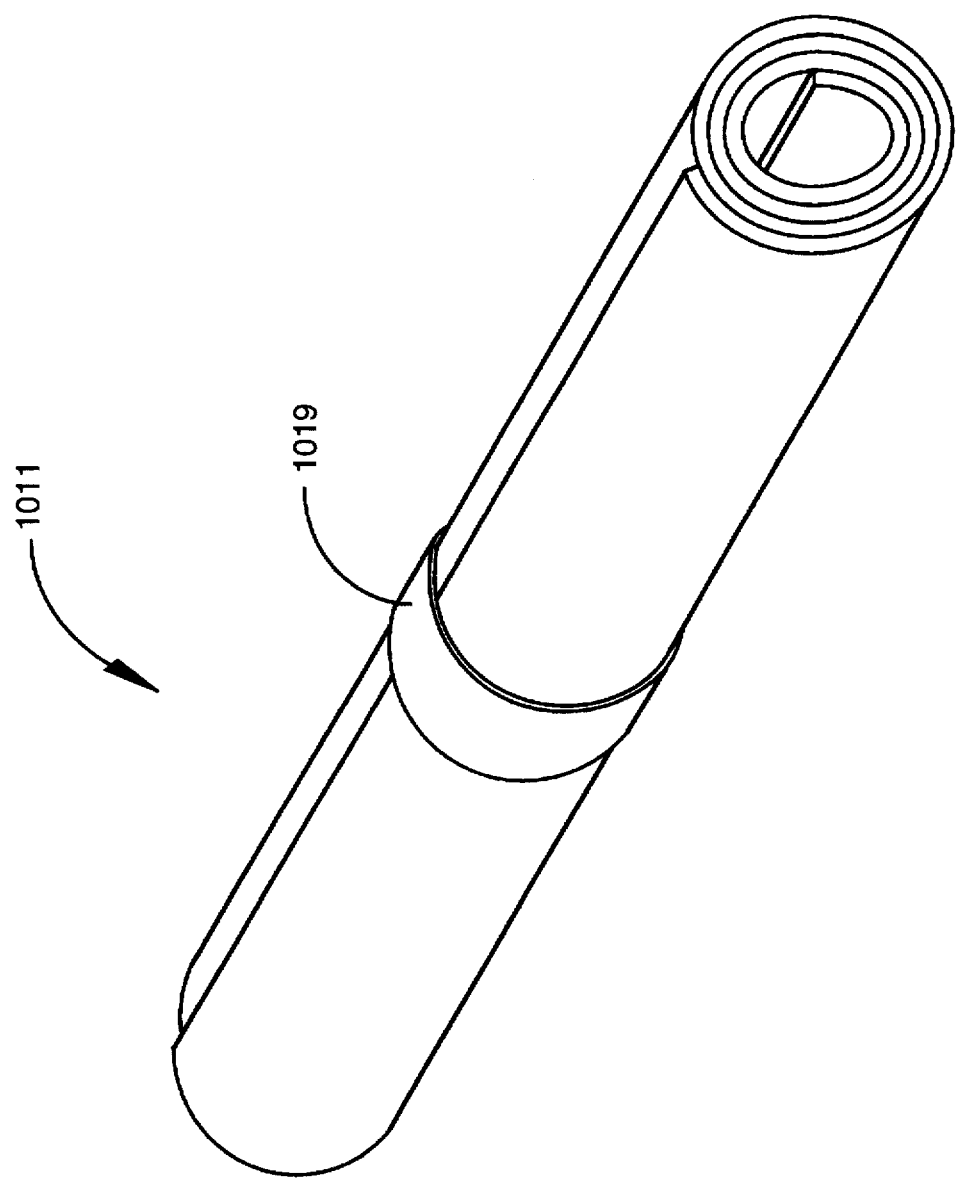
FIG. 22C shows the flexible keyboard of FIG. 22A rolled into a compact cylinder and secured by a band.

FIG. 22C shows flexible keyboard 1011 of FIG. 22A rolled into a compact cylinder and secured by a band 1019. In this view the band is a simple plastic cylinder, but could be any of a number of alternative devices, such as rubber bands, cord, Velcro loops, and the like. There are also several ways that fasteners may be attached to the keyboard to keep the keyboard rolled up, such as Velcro pads attached by adhesive.

Figure 23:
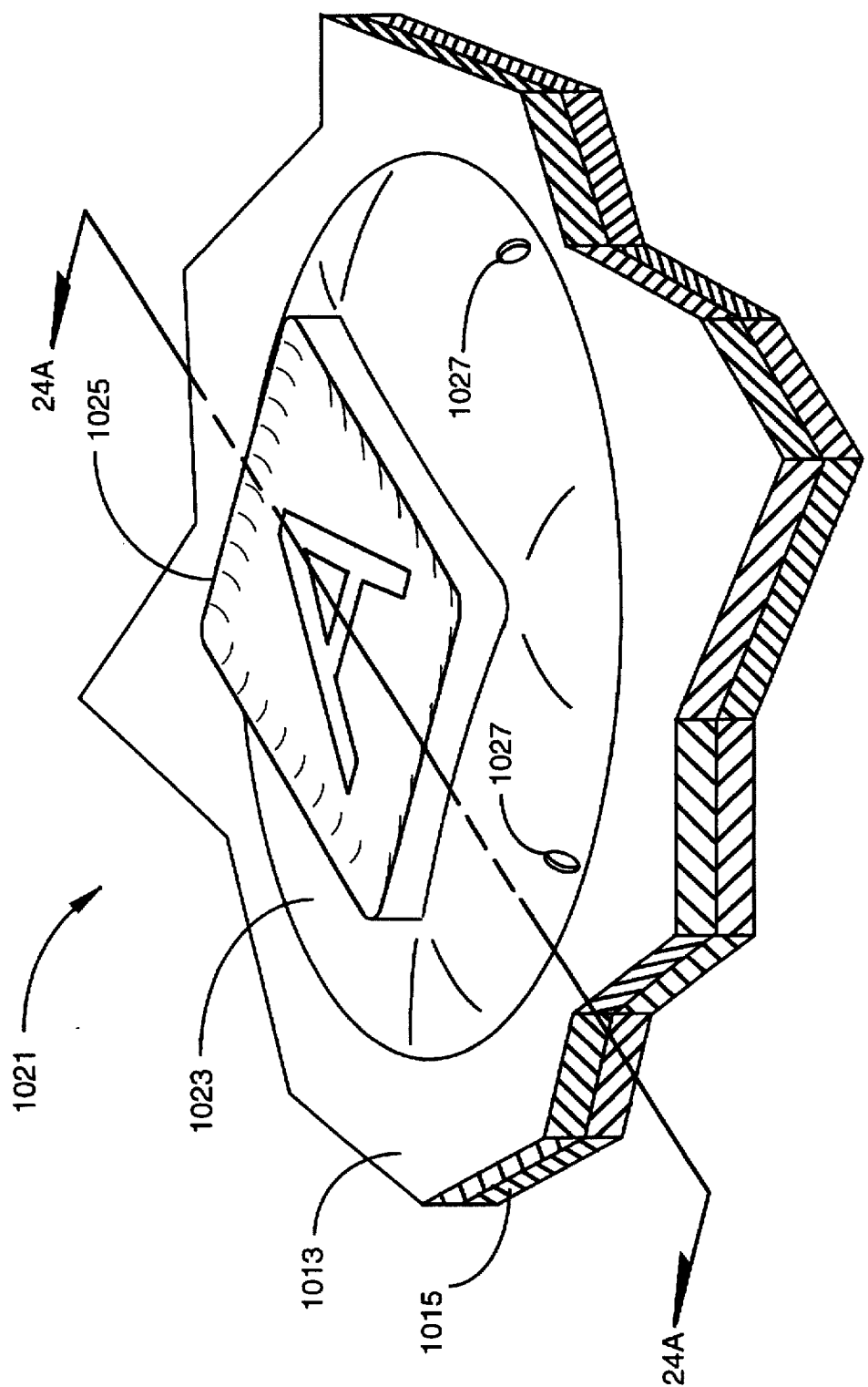
FIG. 23 is an isometric view of a single key cell 21 in the flexible keyboard according to the embodiment of FIGS. 1A and 1B.

FIG. 23 is an isometric view of a single key cell 1021 in the flexible keyboard according to the embodiment of FIGS. 22A and 22B. The key cell is based on a dome shape 1023 molded into upper layer 1013, which provides for necessary vertical movement to accomplish a contact closure for a keystroke and to prevent closure otherwise. The molded dome shape includes a finger pad 1025 molded at the top of the dome. The finger pad may have a concave upper surface with letter or character symbols, such as the letter "A" shown in FIG. 23, applied to the upper surface. The letters or characters may be silkscreened, printed, or applied by a number of other techniques known in the art. The letters and characters may alternatively be molded into the surface as depressions below the level of the finger pad surface, so repeated use is less likely to wear the letters and characters away. Additionally, there may also be "breather" openings 1027 through the sidewall of the dome structure to allow air under the dome to escape when a keystroke is made. When a user presses down on the dome, the dome collapses, and when the pressure is removed, the dome returns to its original shape. That is, the "normal" position of the dome is in the uncollapsed condition.

Figure 24B:
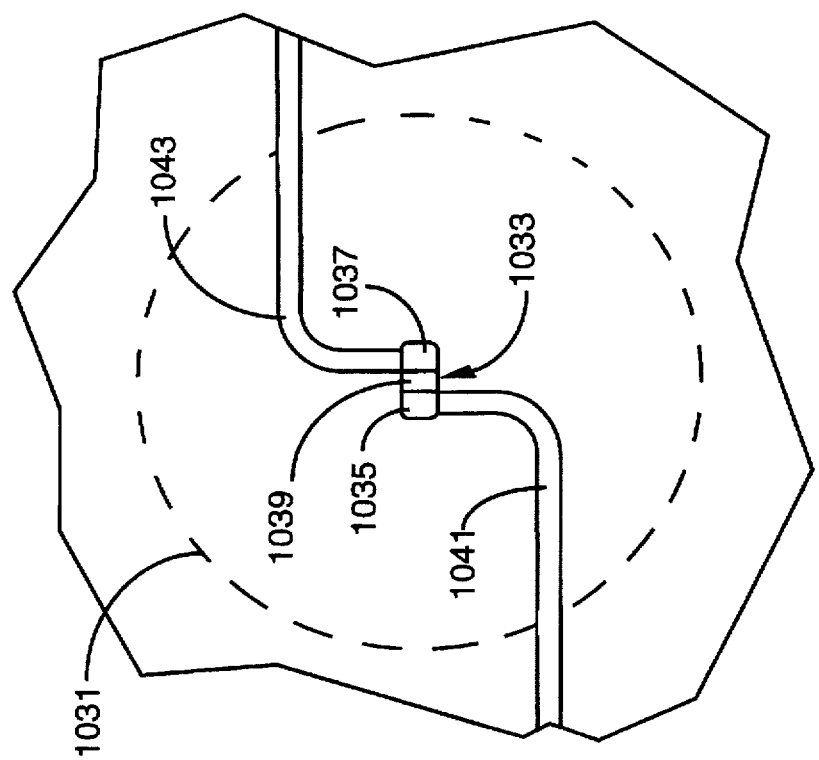
FIG. 24B is a plan view of the lower layer at the key cell of FIG. 24A in the direction of arrow 1029.
Figure 24A:
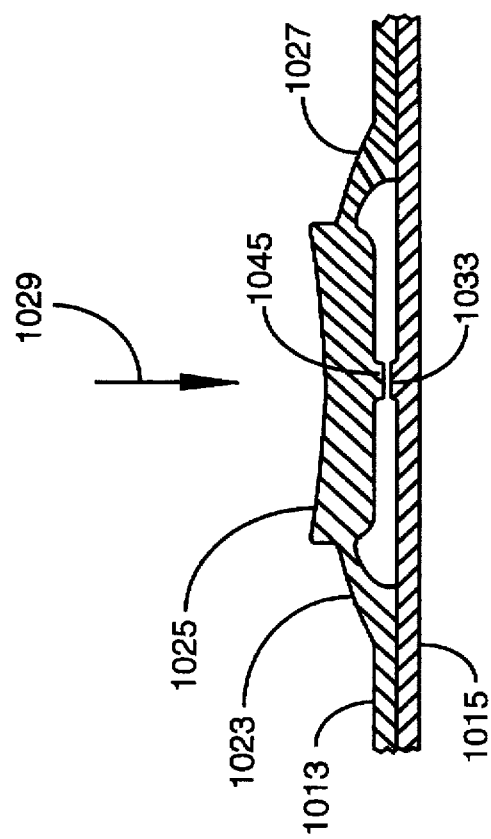
FIG. 24A is a section view of the key cell of FIG. 23 taken along line 24A—24A of FIG. 23.

FIG. 24A is a section view of the key cell of FIG. 23 taken along line 24A—24A. Lower layer 1015 and upper layer 1013 are joined by a fastening technique (not shown) in a manner to position each dome structure in upper layer 1013 over the corresponding conductive structure of lower layer 1015. The fastening technique is described in detail below.

Lower layer 1015, as described briefly above, has electrically conductive traces for signalling keystrokes to control circuit module 1017, for encoding the signals to be transmitted to a computer. FIG. 24B is a plan view of layer 1015 at the key cell of FIG. 24A in the direction of arrow 1029. Dotted circle 1031 represents the outer periphery of dome structure 1023 of upper layer 1013.

In about the center of the dome structure area, lower layer 1015 has a raised portion 1033, also seen in elevation in FIG. 24A. The upper surface of raised portion 1033 is electrically conductive in regions 1035 and 1037, but not in central region 1039. An electrically conductive trace 1041 connects to conductive region 1035, and another electrically conductive trace 1043 connects to conductive region 1037. Raising portion 1033 above the level of the surface of layer 1015 is primarily a convenience rather than a requirement. Also, there are a number of ways conductivity might be imparted to the conductive regions. For example, the traces could be formed by coating the entire surface with conductive material, then removing material to shape the traces. Conductive material could be molded into the flexible material, as well, and there are other ways.

Referring to FIG. 24A, there is a contact closure extender portion 1045 on the lower surface of finger pad 1025 that is similar to raised portion 1033 on lower layer 1015, and positioned directly above portion 1033 when layers 1013 and 1015 are joined. The underside of extender portion 1045 is also electrically conductive, and forms a contact closure element for selectively providing electrical closure between traces 1041 and 1043 when a user depresses dome 1023 by finger pressure. Contact closure causes a signal to be transmitted to control circuit module 1017 to be coded for transmission. The traces and other regions of conductive material can be formed on the flexible surfaces of the molded layers in a number of different ways. In the embodiment described here, these conductive regions may be provided by a conductive, rubber-based coating applied in a conventional manner, such as by silkscreening, and other masking techniques.

It will be apparent to one skilled in the art that there are many variations that could be used for the sidewalls of the dome for an individual key cell. Wall thickness and angle can be varied, for example, to vary the force required to perform a keystroke, which affects the "feel" of the key to a user. Similarly, the key cell can be designed with different distances between raised portion 1033 and extended portion 1045. As shown in FIG. 23, there may be vents 1027 in dome 1023 to allow air to escape from the key cell when it is depressed. The feel of a keystroke can also be varied by varying the number or size of vents 1027.

It is apparent in the plan view FIG. 24A, that there are several different sizes and shapes of key cells in the pattern of the keyboard that are not of the size and shape of the key cell shown in FIGS. 23, 24A, and 24B, but larger. The Enter key is an example. In these cases, substantially all of the upper surface is a finger pad, and the wall and upper sections are designed to provide a similar resistance to manipulation as a smaller key cell.

In the case of these larger key cells, more extensive contact closure patterns are provided on raised portions of lower layer 1015 than the simple pattern shown in FIG. 24B, and corresponding contact closure pads are provided so a keystroke will be accomplished regardless of where on the fingerpad a user depresses the fingerpad.

Figure 25B:
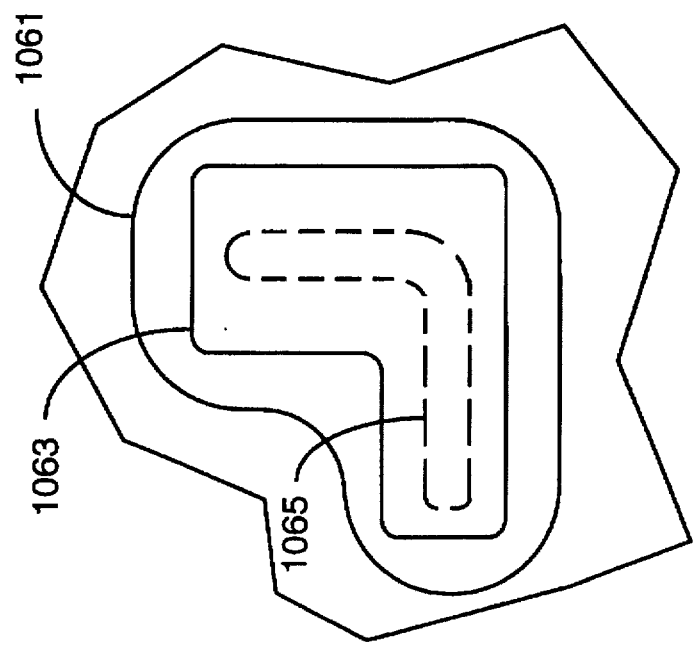
FIG. 25B is a plan view of the upper layer from the same vantage as for FIG. 25A.
Figure 25A:
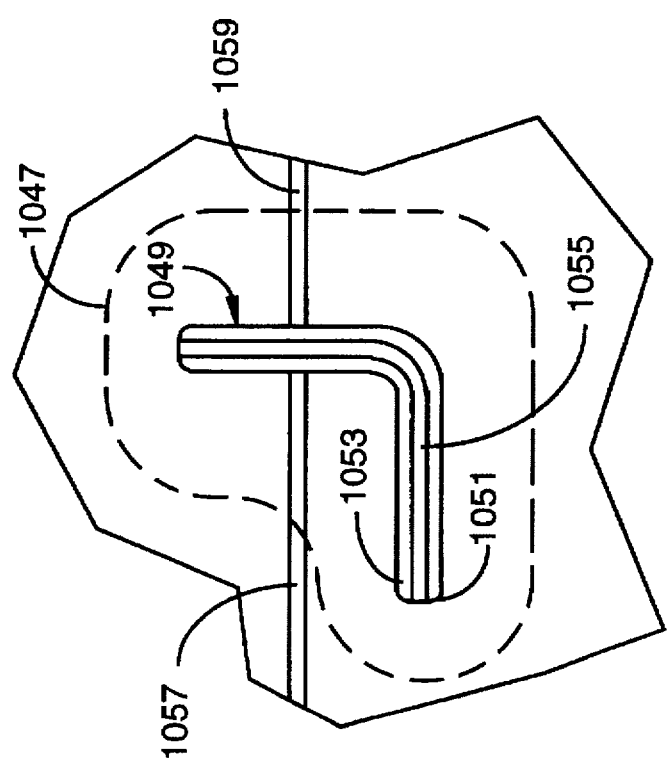
FIG. 25A is a plan view of the lower layer at the position of the Shift key.

FIG. 25A is a plan view of lower layer 1015 at the position of the Enter key to illustrate this principle. Upper layer 1013 is removed in this view. In FIG. 25A, dotted line 1047 outlines the region of the Enter key on the keyboard of FIG. 22A. Raised portion 1049 is shaped to cover the central area enclosed by the extended key cell. Regions 1051 and 1053 are electrically conductive, and region 1055 between the conductive regions is non-conductive. Trace 1057 connects to region 1053 and trace 1059 connects to region 1051.

FIG. 25B is a plan view of upper layer 1013 from the same vantage as for FIG. 25A. Line 1061 is the outline of the dome area for the Enter key, and line 1063 is the outline of the fingerpad area for the Enter key. Dotted outline 1065 is the outline for a contact closure extension on the bottom surface of upper layer 1013 matching the shape of raised portion 1049 of FIG. 25A. The underside of the contact closure extension is electrically conductive as described for the single key cell of FIG. 24A. This arrangement for the contact closure structure allows larger areas to function similarly to the smaller areas.

It will be apparent to one with skill in the art that a long, straight contact closure structure similar to that described for the Enter key would be useful for the space bar, and other shapes could be provided for other keys.

The keyboard of the present invention as thus far described is what is known in the art as a "hard contact" keyboard, which simply means that the keystrokes are contact closures. The "wiring" provided by the electrically conductive traces described above amounts to a conventional matrix circuit generally used in the art for this kind of keyboard. The matrix circuit may be connected to an on-board microprocessor which "reads" the contact closures and codes the information for transmission to a computer. Similarly, the matrix circuit could interface with a multi-lead cable for connection to a computer, and the controller for converting key strokes to digital data for the computers data bus could be in the computer itself, rather than at the keyboard.

Figure 26B:
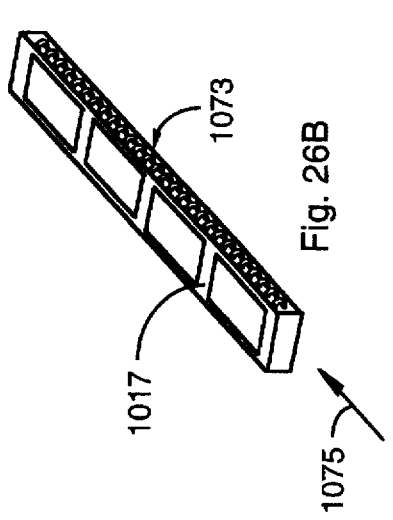
FIG. 26B shows the control circuitry module at an angle of about 90 degrees from the view of FIG. 26A.
Figure 26C:
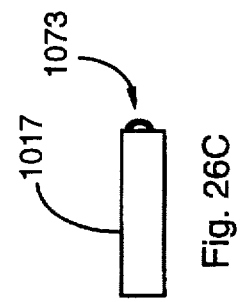
FIG. 26C is a view of the control module in the direction of arrow 75 to illustrate the arrangement of contact pads relative to the module.
Figure 26D:
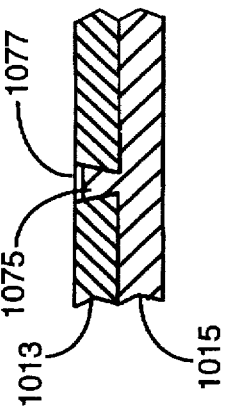
FIG. 26D is a section view taken along line 26D—26D of FIG. 26A with the two layers joined.
Figure 26A:
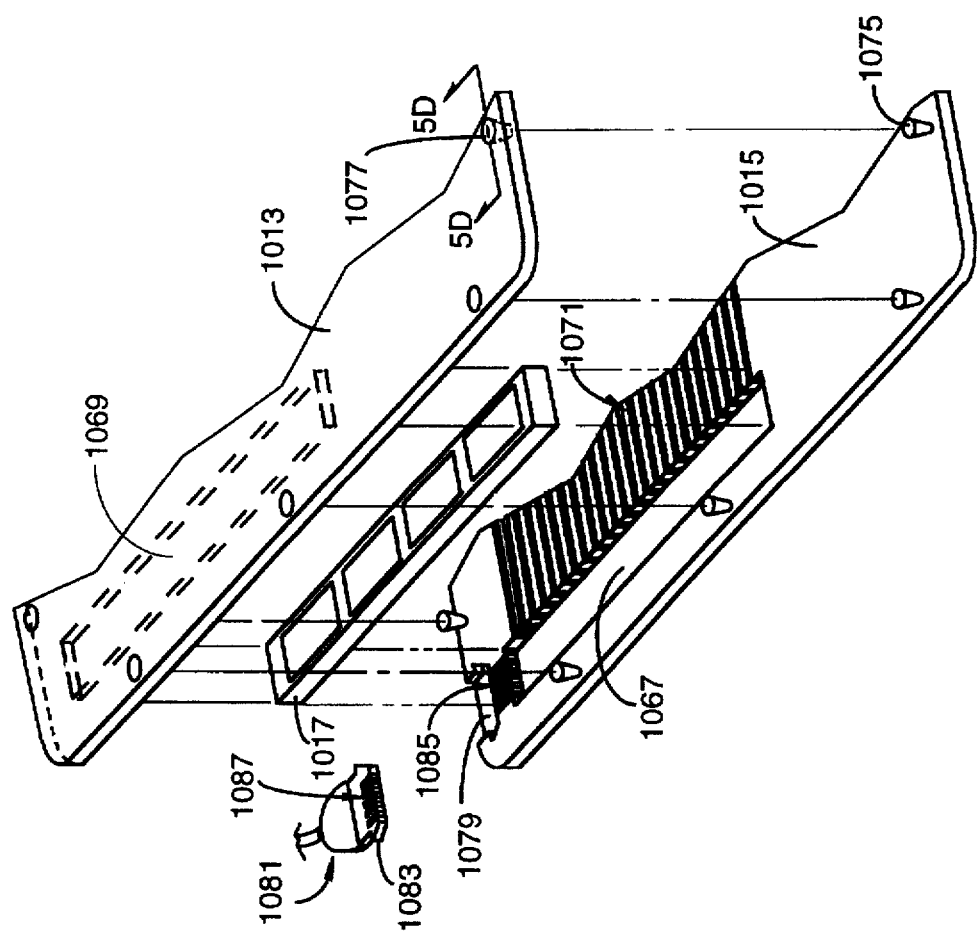
FIG. 26A is an isometric view of the end of the flexible keyboard where the control circuitry is housed, showing the layer separated to illustrate internal details.

FIG. 26A is an isometric view of the end of the flexible keyboard where the control circuitry can be housed, showing layers 1013 and 1015 separated to illustrate internal details. Lower layer 1015 has a pocket 1067 for positioning and retaining control circuit module 1017, and upper layer 1013 has a matching pocket 1069, such that when the layers are joined, the control circuit module is enclosed and retained.

Electrically conductive traces 1071 comprise the traces described above associated with the individual key cells, arranged in a conventional matrix for signalling contact closures of individual keys and key combinations. The traces are formed on the surface of lower layer 1015 and wrap over the edge of pocket 1067, and down the side of the pocket, forming contact pads for interconnecting with control circuit module 1017.

FIG. 26B shows control circuit module 1017 at an angle of about 90 degrees from the view of FIG. 26A. Control circuit module 1017 is shown as an encapsulated unit comprising a microprocessor and associated circuitry for monitoring key activity, encoding the activity, and transmitting the encoded data an associated computer. Encapsulated with module 1017 are contact pads 1073 formed of metallic conductor material, such as wire or strip. Module 1017 comprises the conventional control circuitry commonly used in the art for coding keystrokes, as communicated by the conventional wiring matrix to the key closures, for transmission to an associated computer.

FIG. 26C is a view of module 1017 in the direction of arrow 1075 to illustrate the arrangement of contact pads 1073 relative to module 1017. Contacts 1073 are formed to extend from module 1017 to one side, so when module 1017 is inserted in pocket 1067, contact pads 1073 urge against traces 1071 on the side of the pocket, establishing electrical contact between pads 1073 and traces 1071. The arrangement shown allows relative movement between components when the flexible keyboard is rolled for transport or storage, without damage to conductors or other components.

Keyboard 1011 of the present invention has been described above as having two layers, which is preferred by the inventor to facilitate matrix wiring and other details of the invention. It has been found that some relative movement between the layers is useful when rolling the keyboard as shown in FIG. 22C. Accordingly, keyboard layers 1013 and 1015 are connected by providing receptacle openings in one layer and connector extensions in the other. Extension 1075 from lower layer 1015 and opening 1077 in upper layer 1013 as shown in FIG. 26A are exemplary of such connection means.

FIG. 26D is a section view taken along line 26D—26D of FIG. 26A with layer 1013 and 1015 joined. Bore 1077 is formed in the shape of an inverted, truncated cone when layer 1013 is molded, and extension 1075 is formed in a similar shape when layer 1015 is molded. To join the two layers, the molded extensions are forced into the openings. When the keyboard is subsequently rolled, the extensions flex, allowing limited relative movement between the layers.

It will be apparent to one skilled in the art that there are other, essentially equivalent ways to join the two layers. For example, openings could be provided in both layers, and a separate flexible connector inserted into matching openings to hold the two layers together. There are similarly many different shapes that might be used for the extensions or connectors and the openings.

To serve as an input device for a computer it is necessary that the keystrokes be communicated to the computer. In one embodiment, as described above, keyboard 1011 of the present invention is provided with a controller for transmitting codes to the computer indicating the keystrokes and combinations of keys depressed. In the embodiment of FIG. 26A a connector receptacle 1079 is formed in layer 1015 when the layer is molded. A connector cable 1081 is provided with an end 1083 configured to nest in receptacle 1079.

Conductive traces 1085 similar to the matrix traces described above are applied to lower layer 1015 between pocket 1067 and receptacle 1079, and along the vertical walls of both openings. Module 1017 has contact pads (not shown) on the end facing receptacle 1079, similar to the contact pads 1073 illustrated in FIG. 26B and FIG. 26C. Similarly, cable end 1083 has contact pads 1087 for contacting the traces in receptacle 1079. The other end of cable 1081 has a connector to match the computer receptacle, such as an AMP connector.

Figure 27A:
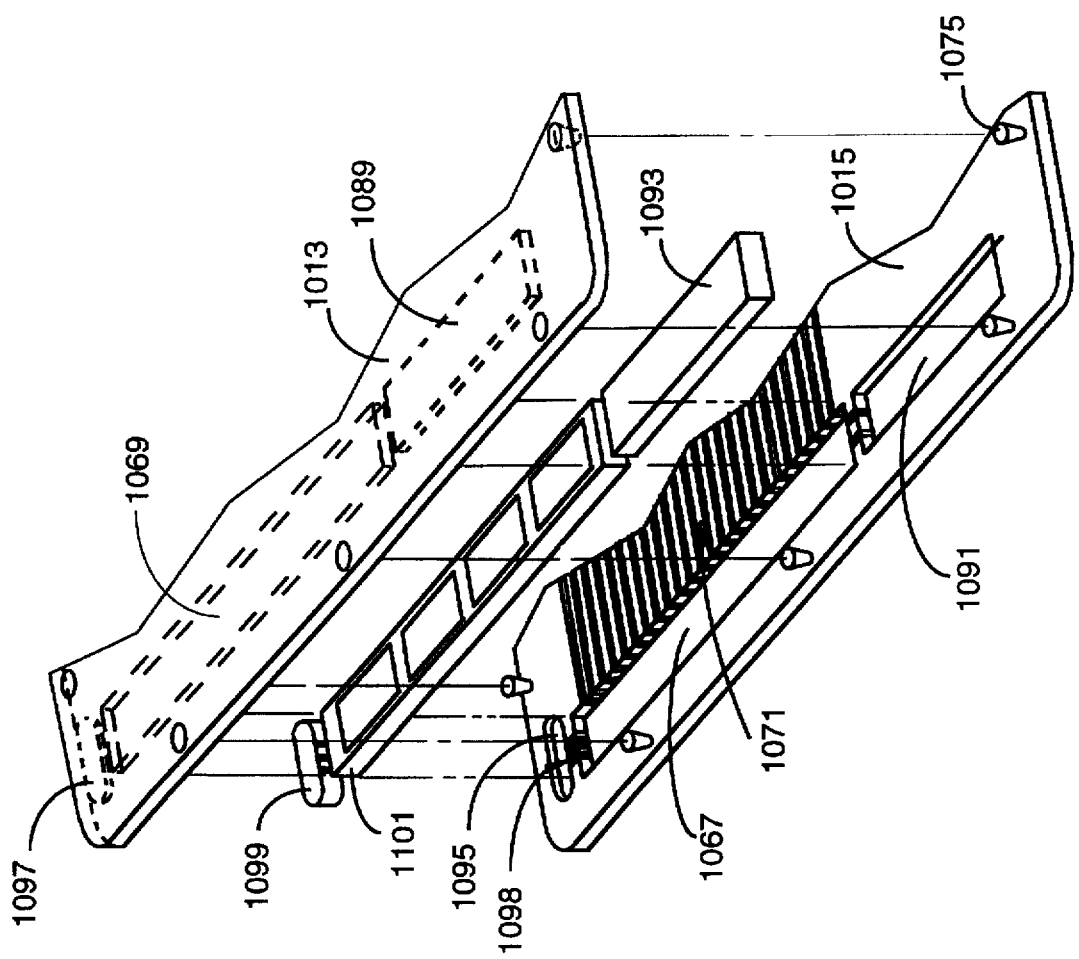
FIG. 27A shows an alternative embodiment that communicates with a suitably equipped computer without a cable.

FIG. 27A shows an alternative embodiment that communicates with a suitably equipped computer without a cable. Layers 1013 and 1015 have pockets 1089 and 1091 respectively for positioning and retaining a battery 1093 which connects to a control module 1101 through traces 1098 between the pockets, similar to traces described above for other connections. The battery is made to be about the width and height of the control module to facilitate rolling of the keyboard.

At the other end of pocket 1067 for control module 1101 there is a pocket 1095 in lower layer 1015 and another pocket 1097 in upper layer 1013 to retain a coreless encapsulated magnetic coil 1099, which is driven by output signals from control module 1101 through connecting traces 1098 as described above. In this embodiment the coil is driven at a controlled frequency, and data to be transmitted to a computer is coded into the changing magnetic field produced by the coil. A sensing coil in a computer senses the coded data, decodes it, and puts it on the computer bus as digital data.

Another means of transmission of data from keyboard 1011 to an associated computer is coded light transmission. In this embodiment, a light transmitter replaces coil 1099, and control module 1101 drives the transmitter to send coded signals to a receiver at the computer. Coded light transmission is known in the art for sending data from a keyboard to a computer.

Figure 27B:
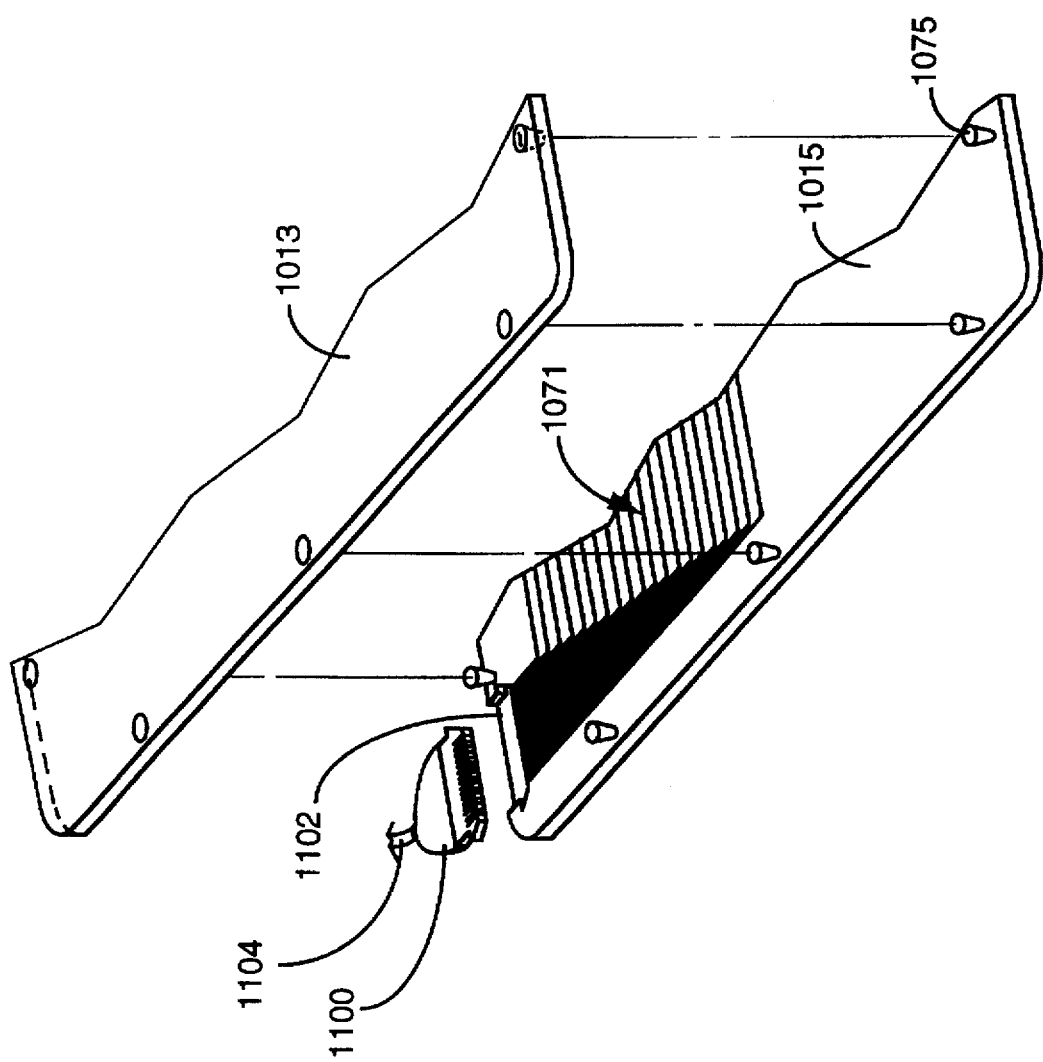
FIG. 27B shows an alternative embodiment wherein the wiring matrix is connected directly to a computer through a connecting cable.

FIG. 27B shows yet another alternative embodiment wherein there is no local control module. In this embodiment conductive traces 1071 lead to a pocket 1102 formed in layer 1015, and a connector 1100 and a cable 1104 have a number of conductors equal to the number of conductive traces. The connector resides in pocket 1102, and the key strokes are communicated through the cable to the computer (not shown). A controller in the computer, not a part of the keyboard, translates the keystrokes, digitizes the data, and places the data on the computer bus. This embodiment has the disadvantage of requiring a cable with many more traces than the embodiments with an on-board controller, but the absence of the controller in the keyboard is an advantage.

Figure 28B:
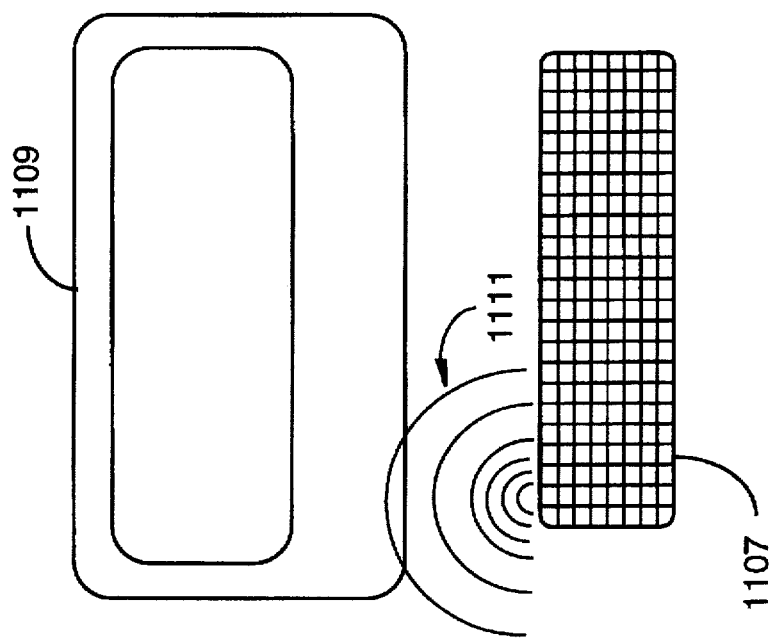
FIG. 28B shows a flexible keyboard according to an embodiment of the invention wherein code is transmitted by a magnetic field.
Figure 28A:
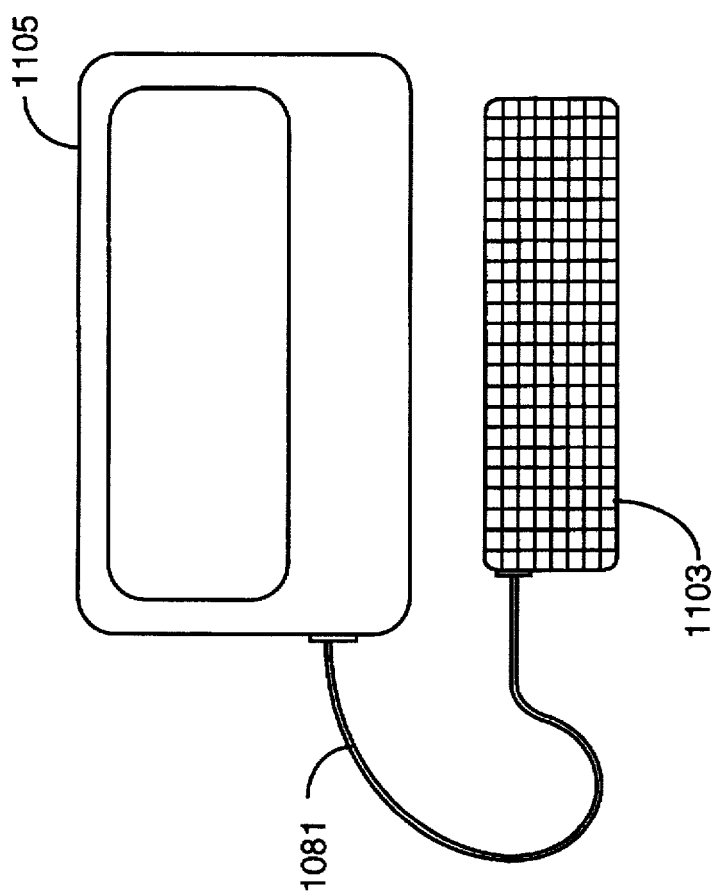
FIG. 28A shows a flexible keyboard according to the present invention connected to a computer by a transmission cable.

FIG. 28A shows a flexible keyboard 1103 according to the present invention connected to a computer 1105 by a transmission cable 1081 as described above. The computer may be of many types, including the popular desktop models. Computers that use keyboards typically include a CPU, an electronic storage system such as a hard disk drive, connected to the CPU and other devices by a bus system, and may also have a display terminal.

FIG. 28B shows a flexible keyboard 1107 according to an embodiment of the invention wherein code is transmitted by a magnetic field, coupled with a computer 1109. The computer in this case has a coil for sensing the magnetic field 1111 produced by the transmission system of the keyboard, and a demodulation system (not shown) for decoding the data transmitted and putting it on the digital bus of the computer for use by the CPU.

It will be apparent to one with skill in the art that there are many changes that might be made to the keyboard embodiments described above without departing from the spirit and scope of the invention. A number of differences within the scope of the invention are described above. There are many materials that would be suitable, for example, and a number of different ways that key cells might be formed. There are also many different ways traces may be routed, many different kinds of material for forming traces, and different places that pockets might be located for components of the keyboard. Such differences should be considered as within the spirit and scope of the invention.

Inductive coupling was briefly described above as a system of communication between a flexible keyboard and a portable computer. Additional detail of inductive coupling for transmitting keystroke codes is disclosed below.

Inductive Keyboard Coupling

All computer systems require user input to perform dedicated functions. In some cases the only input needed is a signal to commence processing according to a preprogrammed list of instructions, typically called a program.

There are dedicated computer systems for receiving special signals, and for automatically processing the signals to some purpose, and storing or displaying a result. An example would be a computerized environmental monitoring station. More commonly, however, computer systems need periodic, and often frequent, alphanumeric and geometric input. This need for frequent alphanumeric and geometric input is typical of what are often termed "general-purpose" computers in the art, which include personal computers of all types, such as desk-top and portable computers.

Typically general-purpose computers have keyboards for alphanumeric input and pointing devices, such as a "mouse" or a trackball for geometric input. Alphanumeric input is useful for such as word processing applications, and geometric input for such as graphic applications. General-purpose computer systems, as a result, almost invariably have keyboards, simulating typewriter keyboards, as an interface for user input.

Keyboards for computers are demanding projects for electromechanical designers, and are arguably the most used and abused part of a computer system. The keyboard, moreover, is a relatively intricate mechanical system, typically requiring a number of moving and interacting parts, and the parts must be capable of being exercised many thousands of times without failure.

Keyboards, too are subject to a constant rain of foreign matter, none of which is usually beneficial to operation. Dust, dirt, moisture, spilled liquids, skin and fingernail material, and more, are common intruders to a keyboard. A good keyboard design has to protect the working elements from intrusion of foreign matter.

Another demanding aspect of keyboard design is the matter of assembling the keystroke data and transmitting the data to the computer or computerized system served. There are a number of different ways keys may be implemented and keystrokes may be detected and converted to data at the host system. Typically the key switches are arranged in a matrix and the rows of the matrix are scanned. This is the multiplexed interface. This can be done in a software-based mode using the host system's CPU, but there are a number of advantages to having an on-board microprocessor at the keyboard.

Typically, for a keyboard with an on-board microprocessor, keystroke data is fed to the microprocessor to be processed, coded, and transmitted. The most common transmission mode is over a serial connecting cable to the host system. When the host computer receives a scan code, the keyboard controller notifies the CPU that a scan code is available to be read.

A good reference on keyboard technology is *Microprocessor Based Design*, by Michael Slater, pages 287–303, Copyright 1989 by Prentice Hall. Another is *The Winn Rosch Hardware Bible* by Winn Rosch, pages 239–257, Copyright 1989 by Winn L. Rosch, and published by Prentice Hall. These sections of the two references are incorporated herein by reference.

The coupling of the keyboard to the host computer by a cable is often restrictive and clumsy. When desk space is limited, for example, space for the cable may be a problem. The length of the cable restricts the position of the keyboard relative to the computer as well. And the cable is another component subject to failure, such as by poor connection at either of two end connectors. There have been attempts prior to the present invention to couple a keyboard to a computer without a cord. For example, IBM introduced the PC Jr. computer with two infra-red emitting LEDs to send out scan codes optically. The system was not very reliable however, and was limited to line-of-sight transmission.

What is needed is an apparatus and method allowing a keyboard to communicate with the host without the necessity of a cable in a manner that is reliable, and not restricted to line-of-sight transmission.

Figure 29:
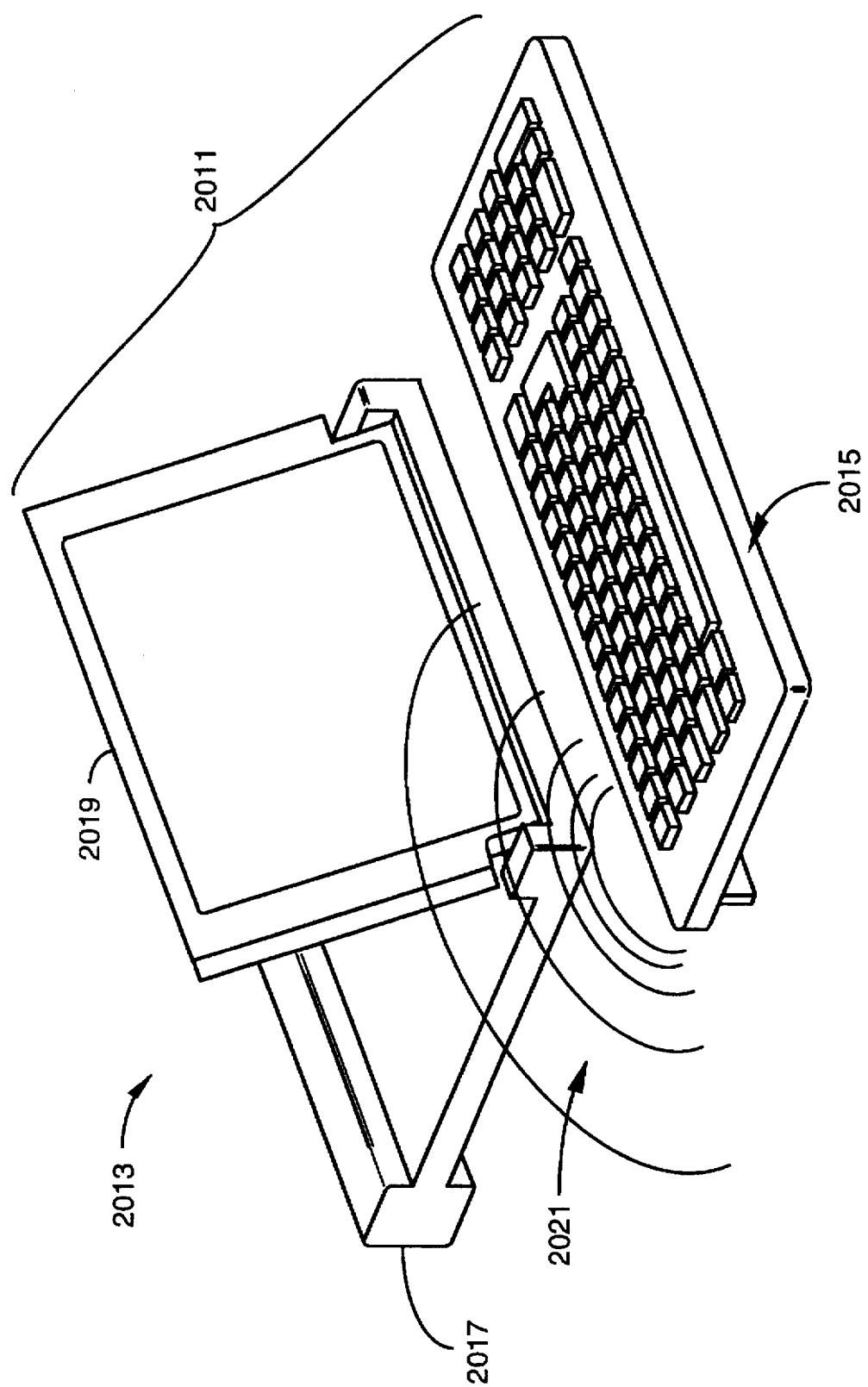
FIG. 29 is a perspective view of a computer with a keyboard according to the present invention.

FIG. 29 is an isometric view of a general-purpose portable computer with a keyboard coupled by induction apparatus according to the present invention. The computer system of FIG. 29 comprises a principle unit 2013 including a housing 2017 and a tilt-up display 2019. The display may be one of several types of available flat-panel displays. Housing 2017 contains the principal electronic operating elements, such as a CPU microprocessor, an I/O bus, and system Ram memory. There are connectors (not shown) for connecting to serial devices and the like, which is typical for portable computers.

A separate keyboard unit 2015 provides alphanumeric and other keystroke input without benefit of a cable connection, by means of encoded information transmitted on a magnetic field represented by magnetic lines of force 1021.

Figure 30:
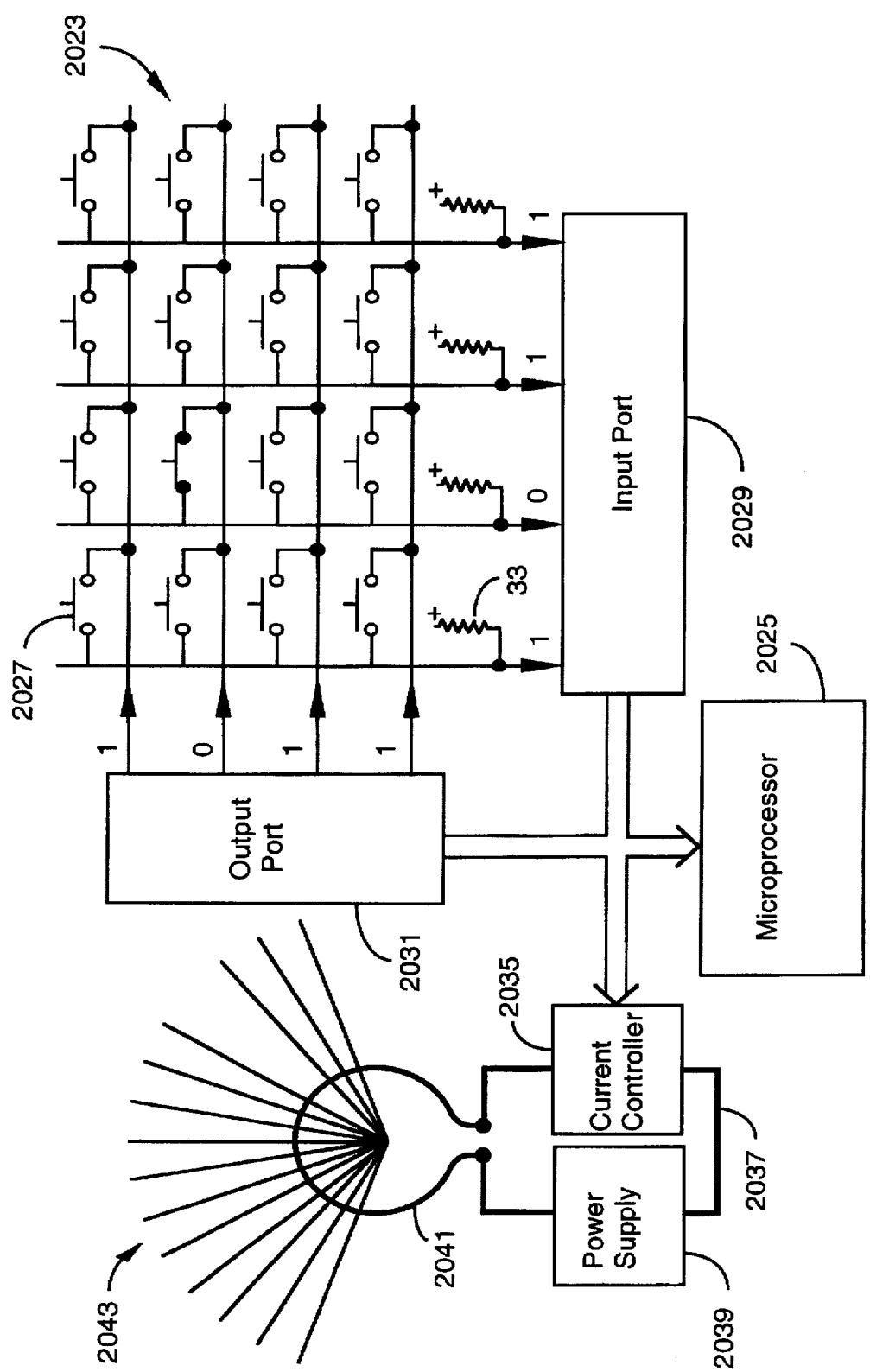
FIG. 30 illustrates a key switch matrix interfaced to a microprocessor and a magnetic transmitter according to the present invention.

FIG. 30 is a schematic illustrating some of the internal elements of keyboard 2015. In this particular embodiment the key switches (hereinafter the keys) are connected in a matrix 2023 and scanned by a microprocessor 2025 contained within the framework of the keyboard. The scanned matrix arrangement greatly reduces the number of I/O port bits needed for large numbers of keys. This scanned matrix arrangement is but one of a number of convention meams by which the key operations may be recognized by an on-board microprocessor, and is used here as an example. The invention may actually be combined with virtually any means known in the art for recognizing and coding the keystrokes. Further, there are a number of other conventional features about keyboards that are not covered here because they have little bearing on the invention. For example, keyboards typically have a small number of indicative LED's for indicating Num Lock, Caps Lock, Scroll Lock, etc., and these features are not described herein.

The scanned matrix of FIG. 30 shows 16 keys interfaced to microprocessor 2025 through a four-bit input port 2029 and a four-bit output port 2031. Pull up resistors (resistor 2033 is an example), connected to an on-board, battery-driven power supply (the connections are not shown in FIG. 30), provide a high level at the input port when no keys a pressed in a column.

In scanning, the matrix is read one row at a time. One of the output port bits is set to 0 while all the others are set to 1. In FIG. 30 the second row down is being read. The keys in rows with the output bit set to 1 are effectively disabled, as pressing a key would only connect a high-level output port bit to an input port bit that is already pulled high by the pull-up resistor. The keys in the row driven by the 0 set bit are active. Pressing any key in the active row pulls the input port bit in the corresponding column low. Each row is read in turn, and the sequence is repeated indefinitely.

The matrix must be fully scanned at a rate to insure if a user quickly presses and releases a key, the contact will not be missed by the microprocessor. In fact, not only the making of a contact is recorded, but breaking as well, which allows for key combinations to be recorded. It will be apparent to those with skill in the art that with the schematic shown, key combinations may result in "ghost" key readings, but this potential problem is handled by placing a diode (not shown) in series with each key.

The 16 key matrix is provided as an example, and is extensible in a number of ways to more keys. For example, input and output ports with more bits may be used. One 16 bit input and one 16-bit output port will support a matrix of 256 keys. Alternatively more ports with four or eight bits may be used. Typically a complete keyboard scan is made once every few milliseconds.

In a conventional keyboard and in the present embodiment of the invention the on-board microprocessor converts the information derived from scanning to hexidecimal scan codes. Typical scan codes are shown in the Winn Rosch Hardware Bible referenced above, on pages 250 through 253, although other scan codes are usable, and new scan codes may be arbitrarily contrived.

In a conventional system, the microprocessor sends the scan codes serially over a four-wire cable, with one wire carrying all of the data. The main portion of the computer in the conventional case receives these scan codes at a special I/O port, where a keyboard controller chip issues an interrupt to the CPU that a scan code is available to be read. The CPU then reads the scan code and interprets the key stroke information as input. The program for doing so is typically a part of the system BIOS.

In the system of the present invention there is no cable to transmit scan codes to the computer. In the embodiment shown by FIG. 30, microprocessor 2025 operates a current controller 2035 controlling current in a circuit 2037 from a power supply 2039. The controlled current passes through a one-turn generator loop 2041, creating a magnetic field represented by exemplary field lines 2043. In FIG. 30 generating loop 2041 is shown in plan view, so magnetic field lines 2043, which are generated orthogonal to the plane of the loop and conventionally circular in nature, are shown as lines.

Figure 31:
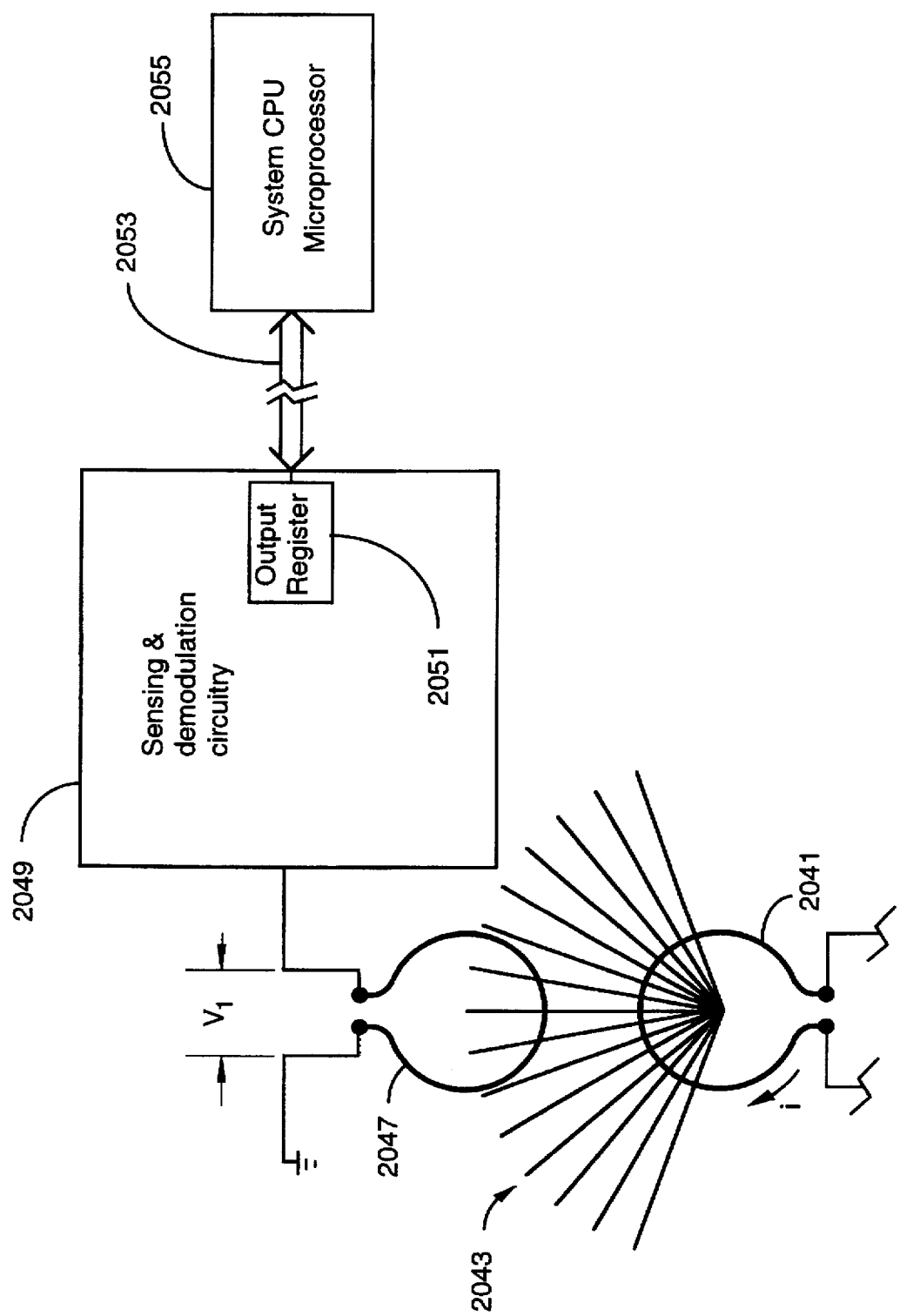
FIG. 31 illustrates a receiver and demodulation circuitry for receiving magnetically encoded scan codes and reconstructing the associated digital scan codes therefrom.

FIG. 31 shows generating loop 2041 of FIG. 30 and a receiving unit 2045 located in housing 2017. Receiving unit 2045 provides the function of the special I/O port that receives scan codes by serial cable for a conventional system, and forwards the codes to the system CPU. In one embodiment receiving unit 2045 is implemented as an add-in card for a general-purpose computer, but in other embodiments, the receiving unit is a hard-wired unit in the computer housing. The latter is the preferred case for notebook, laptop, and other computers meant to be highly portable.

In the present invention information about keystrokes is transmitted to the system CPU via encoded magnetic fluctuations in field 2043. Toward this end unit 2045 has a receiving loop 2047 for intercepting the magnetic field produced by loop 2041. As is well known in field theory, there will be no effect in loop 2047 unless there is a change in the strength of the magnetic field. To transmit information, then, it is necessary that the magnetic field be either expanding or collapsing.

As is known in the art of electrical engineering, there exists a defined property between two electrical circuits called mutual inductance. The mutual inductance determines the emf induced in one circuit as a consequence of a change in current in another. The direction of the emf in the one is, of course, a property of the current direction in the other.

In the embodiment of the present invention shown by FIGS. 30 and 31, a current i produced in loop 2041 produces an emf $V_1$ in loop 2047 by virtue of the change in magnetic field 2043 produced by the change in the current in loop 2047 from 0 to i (and from i to 0). To produce a detectable emf change across the ends of loop 2047, current controller 2035, driven by microprocessor 2025 (FIG. 30) creates a finite burst of current in loop 2041. As this current goes from 0 to i, a positive emf is produced in loop 2047, and as the current in loop 2041 drops back to 0, the emf magnitude in loop 2047 changes to a negative value. The change in emf in the invention affords the ability to transmit scan codes.

It is empirically known and reflected in the concept of mutual inductance that the magnitude of the emf produced in one circuit by a current change in another is proportional to the rate of change of current with respect to time in the one, that is di/dt. Accordingly, the cross section of the transmitting loop is relatively large so as to not present an impediment of high resistance to a rapid rise of current as a result of imposing a voltage on the transmitting loop. In the present embodiment of the invention the transmitting loop is made of square conductor about 2 millimeters on a side and with a mean diameter of about 25 millimeters.

In the embodiment shown, the current for the transmitting loop and for other operations of the keyboard is provided by battery-based power supply 2039. It is desirable therefore that the power requirements for the keyboard be kept to a minimum level. Nevertheless, it is also desirable to operate in a manner to avoid corruption of transmissions with spurious signals caused by ambient magnetic fields, due to current levels in other circuitry of the keyboard, the computer elements in housing 2017, or other equipment that may be in the vicinity of the computer system according to the invention. In the described embodiment current in the transmitting loop is limited to several milliamps, and interference is handled at the receiving unit rather than by higher power requirements for the transmitter.

The induced emf in receiving loop 2047 is monitored by sensing and demodulation circuitry 2049 in the receiving unit according to control routines implemented as part of the system BIOS preferably, and an output register 2051 is set up with received scan codes transmitted from the keyboard. As in a conventional demodulator, when a scan code is "ready" unit 2049 issues an interrupt via I/O bus 2053 to system CPU 2055 that a scan code is available to be read. After a received scan code is read by the system CPU, the output register is reset for the next scan code received.

FIG. 32A is an exemplary trace of a received emf waveform 2057 ($V_1$ across the ends of loop 2047) as a result of managing i in transmitting coil 2041 according to a pre-programmed code protocol. FIG. 32B shows a serial bit pattern 2058 developed as a result of monitoring the received emf waveform.

In the transmission protocol of the embodiment exemplified by FIGS. 32A and 32B, as in a typical serial protocol, there is a pre-programmed bit time, (bt) 2063 which is the reciprocal of the transmission rate (sometimes called the Baud rate). This bit time for scan code transmission need not tax the clock rate of most systems. For example, a very modest ten megahertz clock rate has a period of $10^{-7}$ seconds. Assuming, for example, a bit time of 1000 times the clock period and twelve bit times minimum to transmit one scan code, the code may be transmitted in $1.2 \times 10^{-3}$ seconds. Few people type that fast.

In the present example, the protocol consists of emf spikes across the ends of the receiving loop produced by current bursts in the transmitting loop. Keyboard microprocessor 2025 (FIG. 30) reads the keystrokes, both make and break and key combinations, and sends the scan codes in serial bursts timed according to the bit time. Each current burst in loop 2041 produces a spike such as spike 2059 in loop 2047 which spans about one-fourth of a bit time (this time may vary widely within the bit time).

The scan codes in the present embodiment are the conventional scan codes for U.S. IBM compatible keyboards as referenced above, but there are many alternative codes that might be used in other embodiments.

In FIG. 32A a code start signal is provided by three spikes 2061 timed at twice the bit time rate. Circuitry 2049 (FIG. 31) recognizes the code start signal and monitors the next eight bit times for spikes as indicative of data bits, setting an output register 2051 according to the bits sensed. A bit time with a definite spike is a logical one, and a bit time with no spike produces a logical zero. After the eight bits are transmitted, the transmitter issues a stop code 2065 of five spikes at twice the bit rate, and looks for another start signal. There are a wide variety of start and stop codes (signals) that might be employed in different coding schemes within the scope of the invention, and the means described is but one of the many.

The scan code transmitted in the example of FIG. 32, 00101101, is hex 2D, which is the make code for the "x" key according to the protocol used in the preferred embodiment, which is the conventional scan codes used by most IBM compatible computer keyboard systems. As a user types on the keyboard the system according to the invention continues to interpret the key makes and breaks, and the key combinations used, and sends the scan codes to the computer via the transmission loop and the receiving loop.

It will be apparent to one with skill in the art that there are many alterations that may be made in the inductive coupling embodiments described without departing from the spirit and scope of the invention. A number have such alterations have been mentioned above. There are many more. For example, there is a broad latitude in the dimensions of the transmitting and receiving loops, and in other variables, such as the current generated and the timing of coded data. Similarly, there are many coding schemes that may be used other than the scheme described in the preferred embodiment. There are many other variations within the spirit and scope of the invention.

It will be evident to one with skill in the art that there are many changes that might be made as well in the architectural embodiments relative to docking bays without departing from the spirit and scope of the invention. Many of these alternatives have also been described above. For example, there may be more than the four module bays described, or fewer. There may also be more than one planar array of module bays. To provide more docking bays in a compact arrangement, one might privide two or more planar levels, with multiple docking bays in each plane. Similarly, there are many ways modules may be built to be docked in a framework such as computer 11, 400, or 2013 to form a planar array. There are similarly many different kinds of connectors that might be utilized as well as many kinds of compressed buses that can be used. There are many kinds of modules that may be provided, and many other changes that might be made within the spirit and scope of the invention.

What is claimed is:

1. A modular computer having a CPU coupled to an internal bus, and further comprising:
   a functional module adapted for receiving and translating keyboard scan codes transmitted as variations in a magnetic field;
   a docking bay adapted to dock the functional module and to connect the functional module to the internal bus;
   a display; and
   a cordless keyboard;
   wherein the cordless keyboard comprises a controller adapted for transmitting digital scan codes by a varying magnetic field generated by a magnetic field generator, and wherein digital scan codes transmitted by the keyboard are received and translated by the functional module and communicated to the internal bus.

2. A modular computer as in claim 1 wherein the cordless keyboard comprises at least one layer of rollable flexible material, a plurality of flexible keys formed on the at least one flexible layer, a plurality of sensors underlying the flexible keys, and flexible electrical conductors contacting said plurality of sensors.

3. A modular computer as in claim 2 wherein the flexible keyboard comprises an upper layer having the plurality of flexible keys and a lower layer having the plurality of sensors, the two layers registered such that the keys overlie the sensors.

4. A modular computer as in claim 1 wherein the docking bay and the functional module are configured to a Personal Computer Memory Card International Association (PCMCIA) standard.

5. A modular computer as in claim 1 comprising a plurality of docking bays in a planar array.

6. A modular computer as in claim 1 wherein the display is a flat panel display hinged to a case.

7. A modular computer as in claim 1 wherein the display is a touchscreen display implemented on a surface of a case enclosing the computer.

* * * * *